(12) United States Patent
Hsu et al.

(10) Patent No.: US 8,513,668 B2
(45) Date of Patent: Aug. 20, 2013

(54) THIN FILM TRANSISTOR DEVICE AND MANUFACTURING METHOD THEREOF

(75) Inventors: Wei-Lun Hsu, Hsin-Chu (TW); Chia-Chun Kao, Hsin-Chu (TW); Shou-Peng Weng, Hsin-Chu (TW)

(73) Assignee: AU Optronics Corp., Science-Based Industrial Park, Hsin-Chu (TW)

( * ) Notice: Subject to any disclaimer, the term of this patent is extended or adjusted under 35 U.S.C. 154(b) by 104 days.

(21) Appl. No.: 13/313,023

(22) Filed: Dec. 7, 2011

(65) Prior Publication Data
US 2012/0286279 A1    Nov. 15, 2012

(30) Foreign Application Priority Data
May 11, 2011    (TW) .............................. 100116472 A

(51) Int. Cl.
*H01L 35/24*    (2006.01)
(52) U.S. Cl.
USPC .................................. 257/66; 257/40; 438/99
(58) Field of Classification Search
USPC ......................................................... 257/66
See application file for complete search history.

(56) References Cited

U.S. PATENT DOCUMENTS
7,122,828 B2 * 10/2006 Bao et al. ......................... 257/40
2010/0044700 A1 * 2/2010 Kim et al. ....................... 257/43

FOREIGN PATENT DOCUMENTS
EP    0582486 A2 *    6/1993
GB    0582486      *    6/1993

* cited by examiner

*Primary Examiner* — Telly Green
*Assistant Examiner* — Damon Hillman
(74) *Attorney, Agent, or Firm* — Winston Hsu; Scott Margo

(57) ABSTRACT

A thin film transistor device includes a first conductivity type thin film transistor and a second conductivity type thin film transistor. The first conductivity type thin film transistor includes a first patterned doped layer, a first gate electrode, a first source electrode, a first drain electrode and a first semiconductor pattern. The second conductivity type thin film transistor includes a second patterned doped layer, a second gate electrode, a second source electrode, a second drain electrode and a second semiconductor pattern. The first semiconductor pattern and the second semiconductor pattern form a patterned semiconductor layer. The first patterned doped layer is disposed under the first semiconductor pattern, and the second patterned doped layer is disposed on the second semiconductor pattern.

38 Claims, 24 Drawing Sheets

THIN FILM TRANSISTOR DEVICE AND MANUFACTURING METHOD THEREOF

BACKGROUND OF THE INVENTION

1. Field of the Invention

The present invention relates to a thin film transistor device and a manufacturing method thereof, and more particularly, to a thin film transistor device including a low resistance doped layer formed by a non-implant process and a laser treatment, and a manufacturing method thereof.

2. Description of the Prior Art

Electrical mobility of polysilicon is higher than electrical mobility of amorphous silicon, and performance of polysilicon thin film transistors (TFTs) is generally better than performance of amorphous silicon thin film transistors, which are widely used in TFT-LCD. Related technologies of low temperature polysilicon (LTPS) have been continuously improving, and major problems such as bad film uniformity over large substrate have been gradually ameliorated. Therefore, the LTPS process is also developed for being applied to large substrates. In the conventional LTPS process, a doped layer, which is employed for lowering the contact resistance in the thin film transistor, is generally formed by an ion implant process. In addition to some related technical issues to be solved, the cost of the ion implant machine for large substrate may also be a big problem. Therefore, other approaches for forming the doped layer with low resistance are under development in the related industries.

Additionally, because a N type TFT or a P type TFT may be obtained by combining the polysilicon with different conductivity type doped layers, the LTPS process may generally be employed for forming the N type TFT and the P type TFT on the same substrate. In the conventional LTPS process, a patterned N type doped layer and a patterned P type doped layer are formed on a same surface. Additional processes are required for avoiding interfering with each other when forming the patterned N type doped layer and the patterned P type doped layer. Process may then become more complex, and related cost may increase too.

SUMMARY OF THE INVENTION

One of the objectives of the present invention is to provide a thin film transistor device and a manufacturing method thereof. A low resistance doped layer is formed by a non-implant process and a laser treatment, and different conductivity type doped layers are disposed on different levels for achieving purposes of process simplification, performance enhancement, and cost reduction.

To achieve the purposes described above, a preferred embodiment of the present invention provides a thin film transistor device. The thin film transistor device comprises a first conductivity type thin film transistor and a second conductivity type thin film transistor. The first conductivity type thin film transistor comprises a first patterned doped layer, a first gate electrode, a first source electrode, a first drain electrode, and a first semiconductor pattern. The second conductivity type thin film transistor comprises a second patterned doped layer, a second gate electrode, a second source electrode, a second drain electrode, and a second semiconductor pattern. The first source electrode and the first drain electrode are electrically connected to the first patterned doped layer; and the second source electrode and the second drain electrode are electrically connected to the second patterned doped layer. The first semiconductor pattern and the second semiconductor pattern form a patterned semiconductor layer. The first patterned doped layer is disposed under the first semiconductor pattern, and the second patterned doped layer is disposed on the second semiconductor pattern.

To achieve the purposes described above, a preferred embodiment of the present invention provides a manufacturing method of a thin film transistor device. The manufacturing method of the thin film transistor device comprises the following steps. Provide a substrate, which has a first conductivity type region and a second conductivity type region. Form a first patterned doped layer on the first conductivity type region of the substrate. Form a semiconductor layer on the first conductivity type region and the second conductivity type region of the substrate. The semiconductor layer within the first conductivity type region covers the first patterned doped layer. Form a second patterned doped layer on the semiconductor layer within the second conductivity type region. Pattern the semiconductor layer, and separate the semiconductor layer within the first conductivity type region accordingly from the semiconductor layer within the second conductivity type region. Perform at least a laser treatment on the semiconductor layer, the first patterned doped layer, and the second patterned doped layer.

In the present invention, the non-implant process is employed for forming different conductivity type doped layers on different surfaces, and the laser treatment is employed for lowering the electrical resistance of the doped layer. Objects of forming high performance thin film transistors with different conductivity types and simplifying manufacturing processes may be obtained at the same time.

These and other objectives of the present invention will no doubt become obvious to those of ordinary skill in the art after reading the following detailed description of the preferred embodiment that is illustrated in the various figures and drawings.

DETAILED DESCRIPTION

To provide a better understanding of the present invention to users skilled in the technology of the present invention, preferred embodiments are detailed as follows. The preferred embodiments of the present invention are illustrated in the accompanying drawings with numbered elements to clarify the contents and effects to be achieved.

Figure 1:
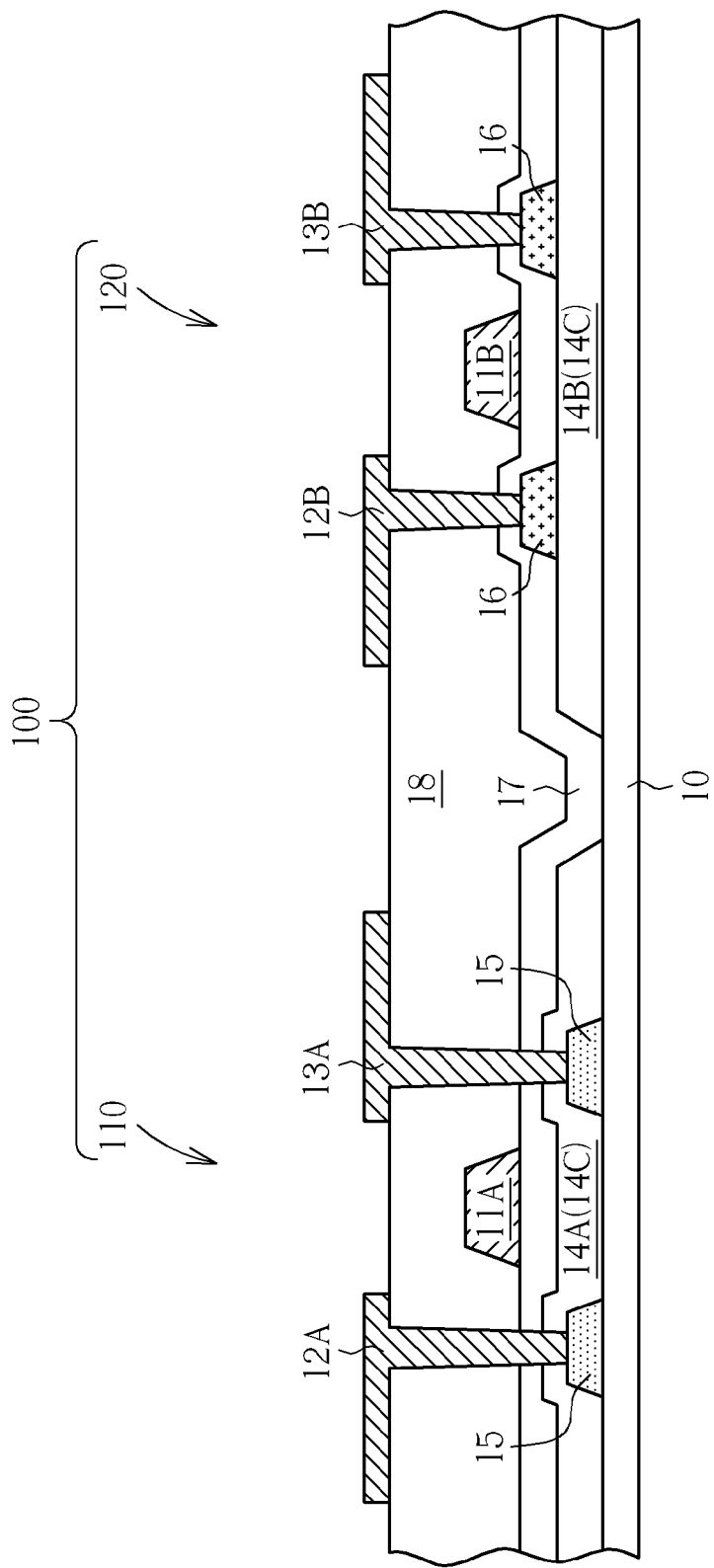
FIG. 1 is a schematic diagram illustrating a thin film transistor device according to a first preferred embodiment of the present invention.

Please refer to FIG. 1, which is a schematic diagram illustrating a thin film transistor device according to a first preferred embodiment of the present invention. Please note that the figures are only for illustration and the figures may not be to scale. The scale may be further modified according to different design considerations. As shown in FIG. 1, a thin film transistor device 100 disposed on a substrate 10 includes a first conductivity type thin film transistor 110 and a second conductivity type thin film transistor 120. The first conductivity type thin film transistor 110 includes a first patterned doped layer 15, a first gate electrode 11A, a first source electrode 12A, a first drain electrode 13A, and a first semiconductor pattern 14A. The second conductivity type thin film transistor 120 includes a second patterned doped layer 16, a second gate electrode 11B, a second source electrode 12B, a second drain electrode 13B, and a second semiconductor pattern 14B. In this embodiment, the first patterned doped layer 15 may include at least one N type dopant such as phosphorus or other phosphorous compounds, the second patterned doped layer 16 may include at least one P type dopant such as boron or other boronic compounds. But the present invention is not limited to these: other appropriate N type dopants and P type dopants may be respectively used to form the first patterned doped layer 15 and the second patterned doped layer 16. Additionally, in this embodiment, the first conductivity type thin film transistor 110 is preferably a N type thin film transistor, and the second conductivity type thin film transistor 120 is preferably a P type thin film transistor, but the present invention is not limited to this. The first source electrode 12A and the first drain electrode 13A are electrically connected to the first patterned doped layer 15, and the second source electrode 12B and the second drain electrode 13B are electrically connected to the second patterned doped layer 16. In this embodiment, the first semiconductor pattern 14A and the second semiconductor pattern 14B form a patterned semiconductor layer 14C, i.e. the first semiconductor pattern 14A and the second semiconductor pattern 14B are respectively a part of the patterned semiconductor layer 14C, but not limited thereto. For example, the first semiconductor pattern 14A and the second semiconductor pattern 14B may be different semiconductor materials in other embodiments of the present invention.

In this embodiment, the patterned semiconductor layer 14C may include a polysilicon layer, but the present invention is not limited to this and other appropriate semiconductor materials such as amorphous silicon semiconductor material, oxide semiconductor material, and organic semiconductor material may be employed to form the patterned semiconductor layer 14C. As shown in FIG. 1, the first patterned doped layer 15 is disposed under the first semiconductor pattern 14A, and the second patterned doped layer 16 is disposed on the second semiconductor pattern 14B. In this embodiment, the first patterned doped layer 15 and the second patterned doped layer 16 may be formed by a non-implant process such as a chemical vapor deposition process, but not limited thereto. For instance, the first patterned doped layer 15 and the second patterned doped layer 16 may be formed by an implant process in other embodiments of the present invention. It is worth noticing that, as shown in FIG. 1, the thin film transistor device 100 of this embodiment may further include a gate insulating layer 17 disposed on the patterned semiconductor layer 14C, on the first patterned doped layer 15 and on the second patterned doped layer 16. The first gate electrode 11A and the second gate electrode 11B are disposed on the gate insulating layer 17. Therefore, in this embodiment, the first conductivity type thin film transistor 110 and the second conductivity type thin film transistor 120 may be regarded as top-gate thin film transistors.

In addition, the thin film transistor device 100 of this embodiment may further include an inter layer dielectric 18 disposed on the gate insulating layer 17, on the first gate electrode 11A, and on the second gate electrode 11B. The first source electrode 12A and the first drain electrode 13A penetrate the inter layer dielectric 18, the gate insulating layer 17, and the first semiconductor pattern 14A to electrically connect to the first patterned doped layer 15. The second source electrode 12B and the second drain electrode 13B penetrate the inter layer dielectric 18 and the gate insulating layer 17 to electrically connect to the second patterned doped layer 16. It is worth noticing that, according to the structure of the thin film transistor device 100 in this embodiment, a patterned conducting layer (not shown) may be employed for forming the first source electrode 12A, the first drain electrode 13A, the second source electrode 12B, and the second drain electrode 13B. The purpose of process simplification may then be achieved, but the present invention is not limited to this. The source electrodes and the drain electrodes may be formed by the identical conducting material or be formed by different conducting materials based on different design considerations.

Figure 2:
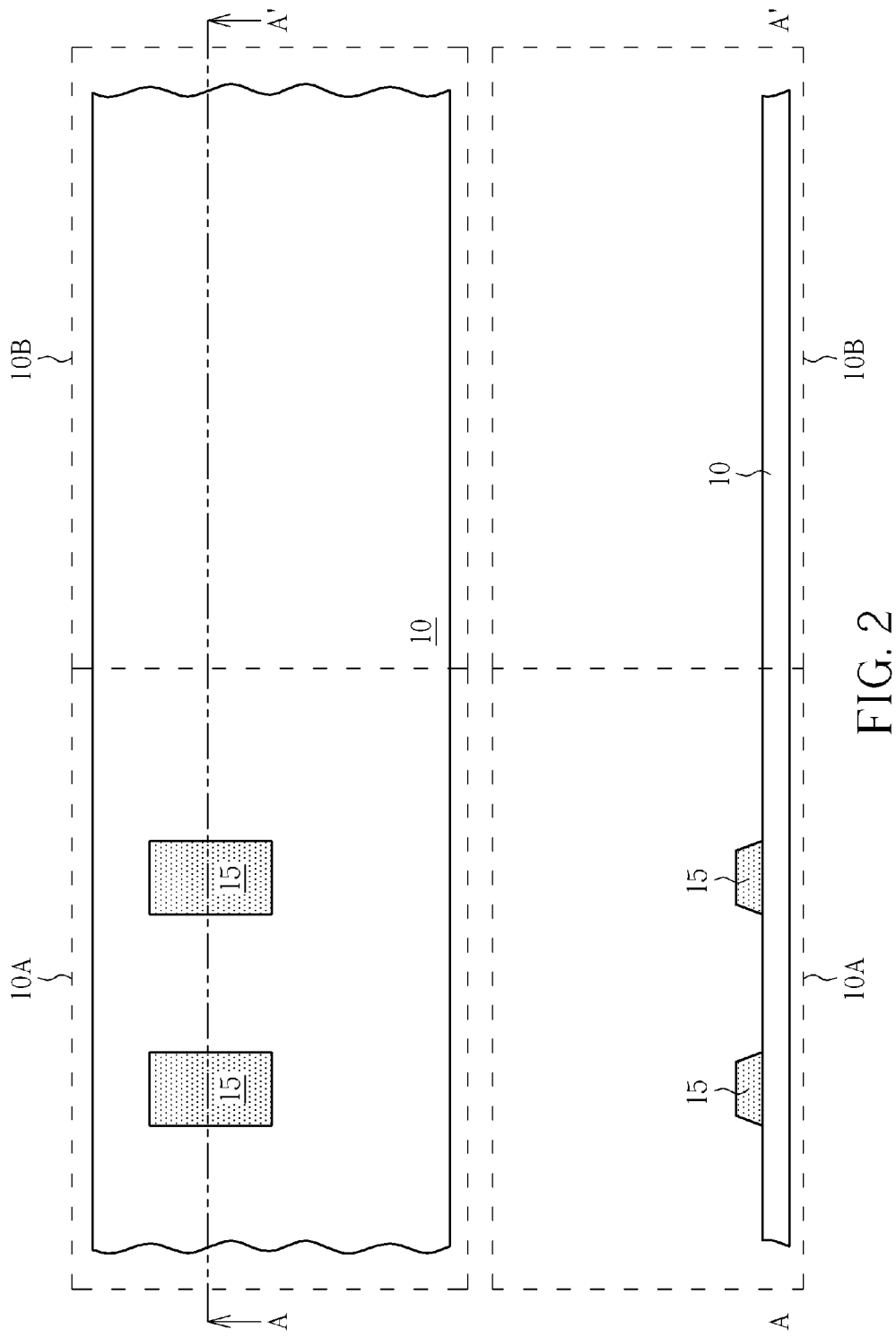
FIGS. 2-9 are schematic diagrams illustrating a manufacturing method of a thin film transistor device according to a first preferred embodiment of the present invention.

Please refer to FIGS. 2-9. FIGS. 2-9 are schematic diagrams illustrating a manufacturing method of a thin film transistor device according to a first preferred embodiment of the present invention. In of FIGS. 2-9, an upper part of each figure is a top-view diagram and a lower part of each figure is a cross-sectional view diagram which is taken along a cross-sectional line A-A' in the corresponding upper part diagram. In this embodiment, the manufacturing method of the thin film transistor device includes the following steps. As shown in FIG. 2, a substrate 10 is provided, and the substrate 10 has a first conductivity type region 10A and a second conductivity type region 10B. A first patterned doped layer 15 is then formed on the first conductivity type region 10A of the substrate 10. In this embodiment, the first patterned doped layer 15 may include at least one N type dopant such as phosphorus or other phosphorous compounds, but not limited thereto. A non-implant process such as chemical vapor deposition process, physical vapor deposition process, or spin-on process may be employed for forming the first patterned doped layer 15, and dopants may be mixed into the first patterned doped layer 15 while forming the first patterned doped layer 15, but the present invention is not limited to this and the procedure of film forming may be separated from the procedure of ion doping.

Figure 3:
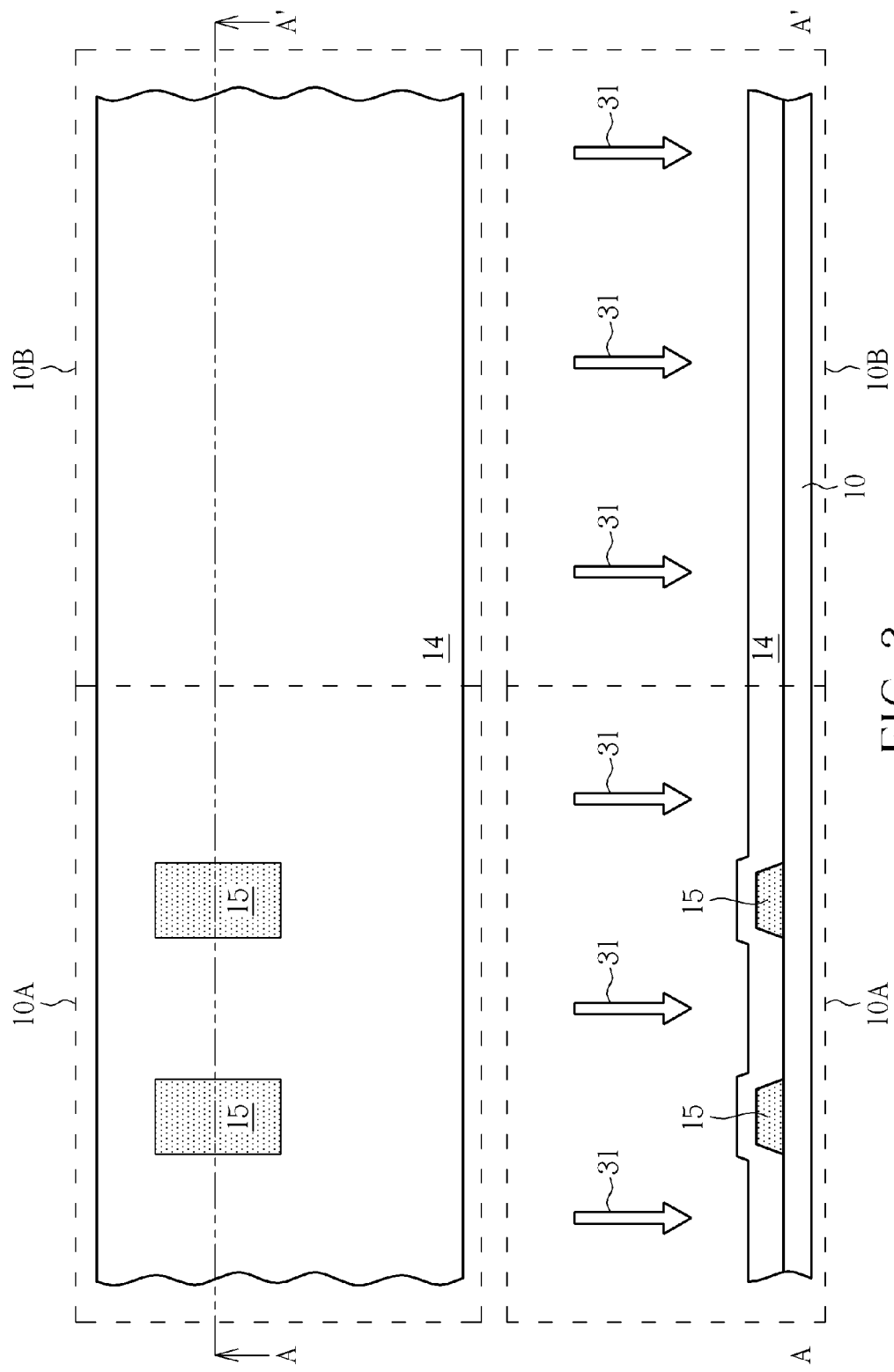

As shown in FIG. 3, a semiconductor layer 14 is then formed on the first conductivity type region 10A and the second conductivity type region 10B of the substrate 10. In this embodiment, the semiconductor layer 14 may include an amorphous silicon layer, but not limited thereto. The semiconductor layer 14 within the first conductivity type region 10A covers the first patterned doped layer 15. Subsequently, a laser treatment 31 is performed on the semiconductor layer 14 and the first patterned doped layer 15. In this embodiment, the semiconductor layer 14 is transformed from an amorphous silicon layer into a polysilicon layer by the laser treatment 31, but not limited thereto. It is worth noticing that the laser treatment 31 may also be employed for lowering the electrical resistance of the first patterned doped layer 15 simultaneously. In the manufacturing method of this embodiment, the laser treatment 31 may be performed once for treating the semiconductor layer 14 and the first patterned doped layer 15 at the same time. In other embodiments of the present invention, another laser treatment may be performed before forming the semiconductor layer 14 for lowering the electrical resistance of the first patterned doped layer 15, and the laser treatment 31 may then be performed after forming the semiconductor layer 14 for treating the semiconductor layer 14 and further lowering the electrical resistance of the first patterned doped layer 15.

Figure 4:
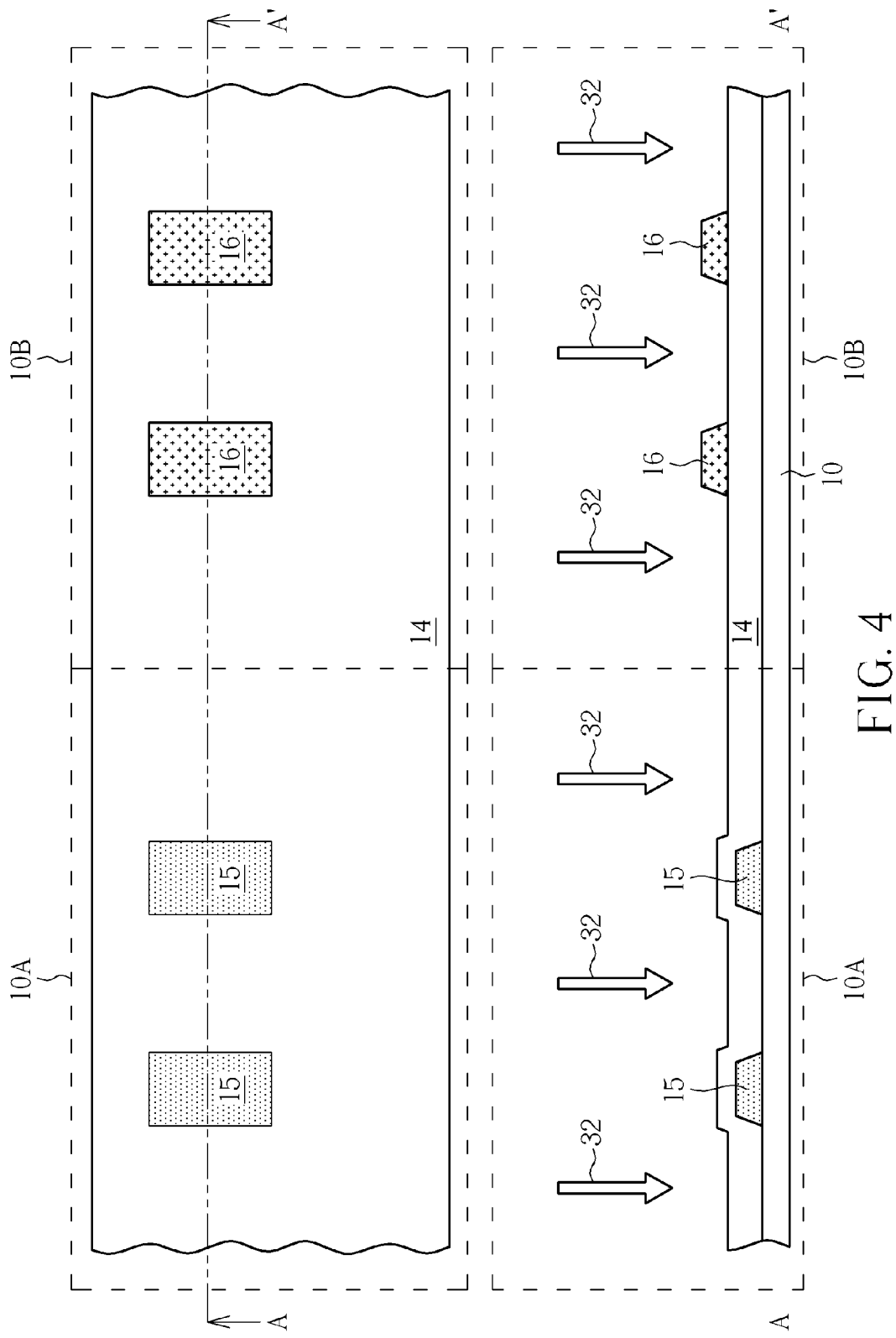

As shown in FIG. 4, a second patterned doped layer 16 is formed on the semiconductor layer 14 within the second conductivity type region 10B. In this embodiment, the second patterned doped layer 16 may include at least one P type dopant such as boron or other boronic compounds, but not limited thereto. The forming method of the second patterned doped layer 16 is similar to the forming method of the first patterned doped layer, which is detailed above and will not be redundantly described. It is worth noticing that, as shown in FIG. 4, the manufacturing method of the present invention may include performing a laser treatment 32 on the semiconductor layer 14, the first patterned doped layer 15, and the second patterned doped layer 16. The laser treatment 32 may be employed for lowering the electrical resistance of the second patterned doped layer 16, transforming the semiconductor layer 14 from an amorphous silicon layer into a polysilicon layer, or lowering the electrical resistance of the first patterned doped layer 15, but not limited thereto. For example, the manufacturing method of the present invention may include only one laser treatment such as the laser treatment 32 for treating the semiconductor layer 14, the first patterned doped layer 15, and the second patterned doped layer 16 simultaneously. The manufacturing process may be simplified this way. In other embodiments of the present invention, a laser treatment may be selectively performed before forming the semiconductor layer 14, and/or the laser treatment 31 may be selectively performed before forming the second patterned doped layer 16, for effectively lowering the electrical resistances of the first patterned doped layer 15 and the second patterned doped layer 16. In other words, the manufacturing method of the thin film transistor device of the present invention may include performing the laser treatment twice, respectively before and after forming the second patterned doped layer 16.

Figure 5:
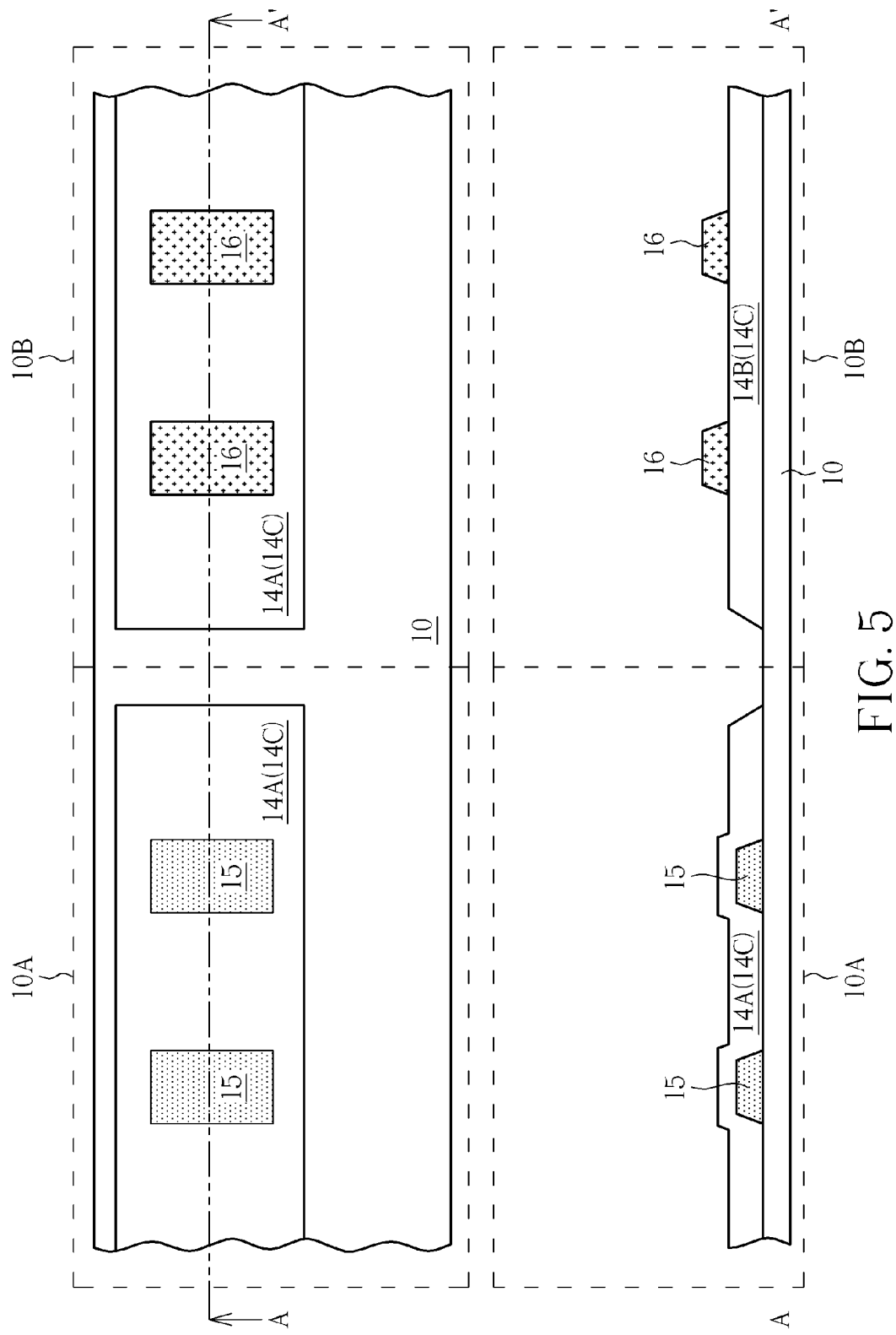
Figure 6:
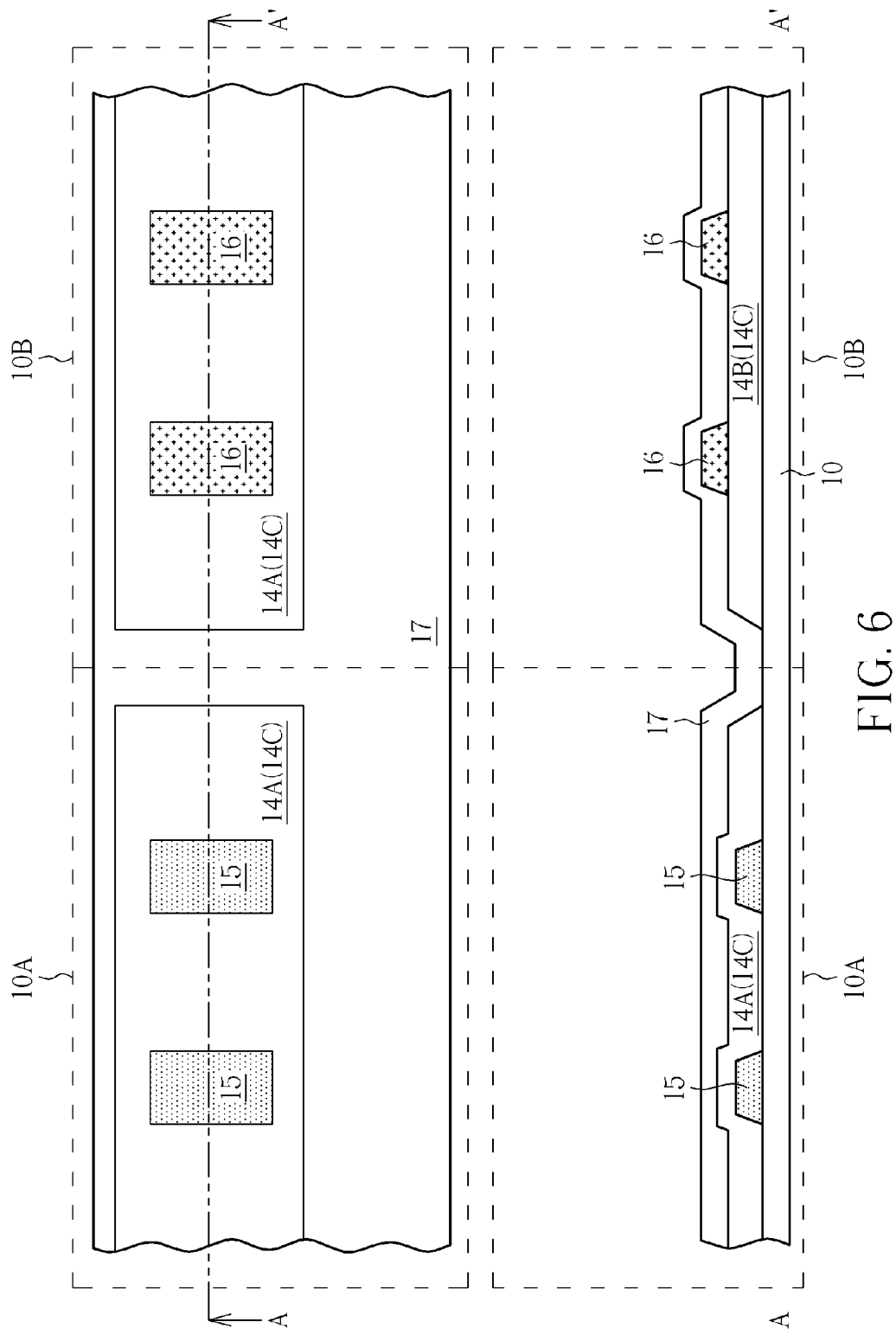

As shown in FIG. 5, the semiconductor layer 14 is then patterned, and the semiconductor layer 14 within the first conductivity type region 10A is accordingly separated from the semiconductor layer 14 within the second conductivity type region 10B. In this embodiment, a patterned semiconductor layer 14C is formed after patterning the semiconductor layer 14. The patterned semiconductor layer 14C includes a first semiconductor pattern 14A in the first conductivity type region 10A and a second semiconductor pattern 14B in the second conductivity type region 10B. As shown in FIG. 6, a gate insulating layer 17 is then formed for covering the semiconductor layer 14 within the first conductivity type region 10A, the semiconductor layer 14 within the second conductivity type region 10B, and the second patterned doped layer 16. In other words, the gate insulating layer 17 covers the first semiconductor pattern 14A, the second semiconductor pattern 14B, and the second patterned doped layer 14.

Figure 7:
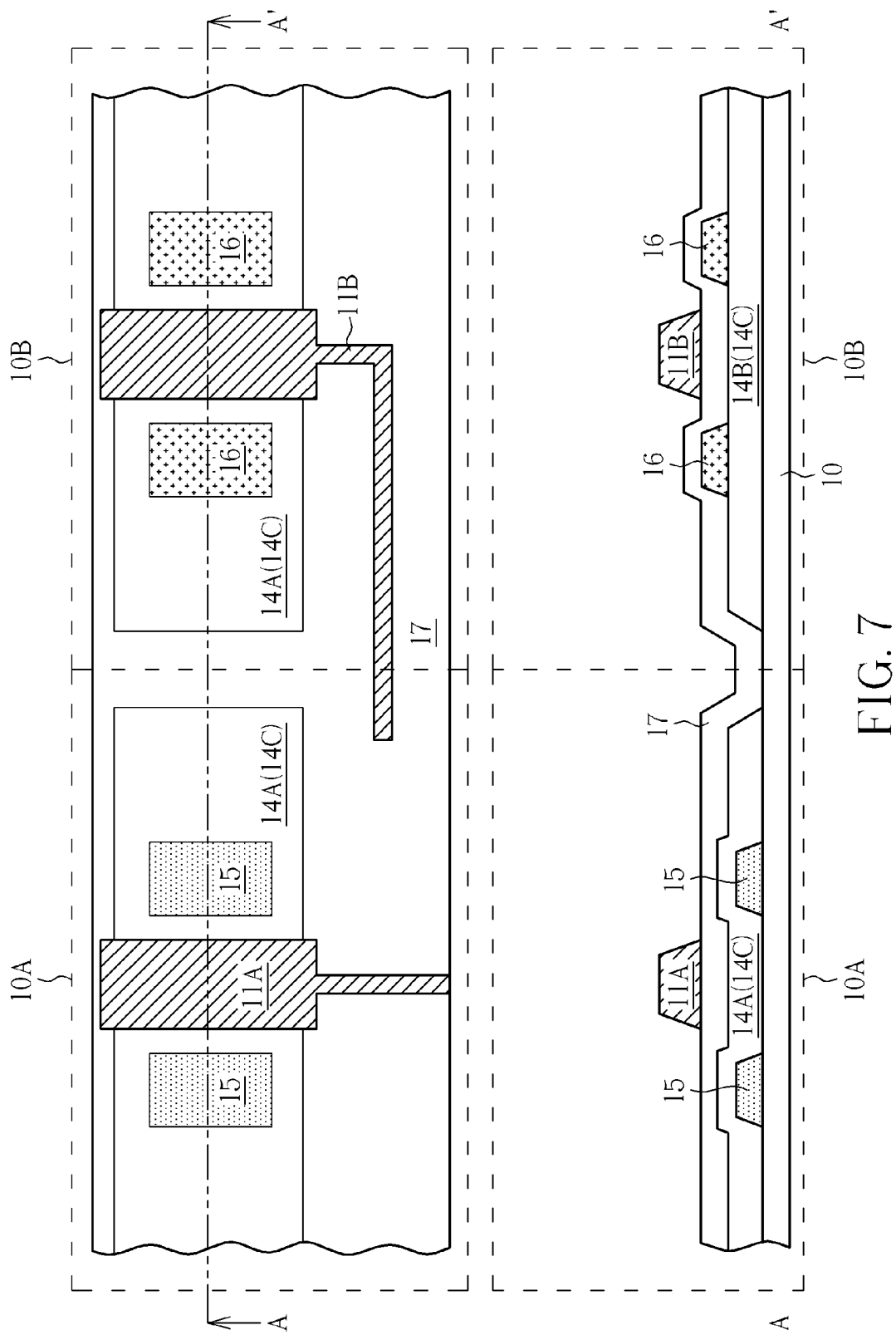
Figure 8:
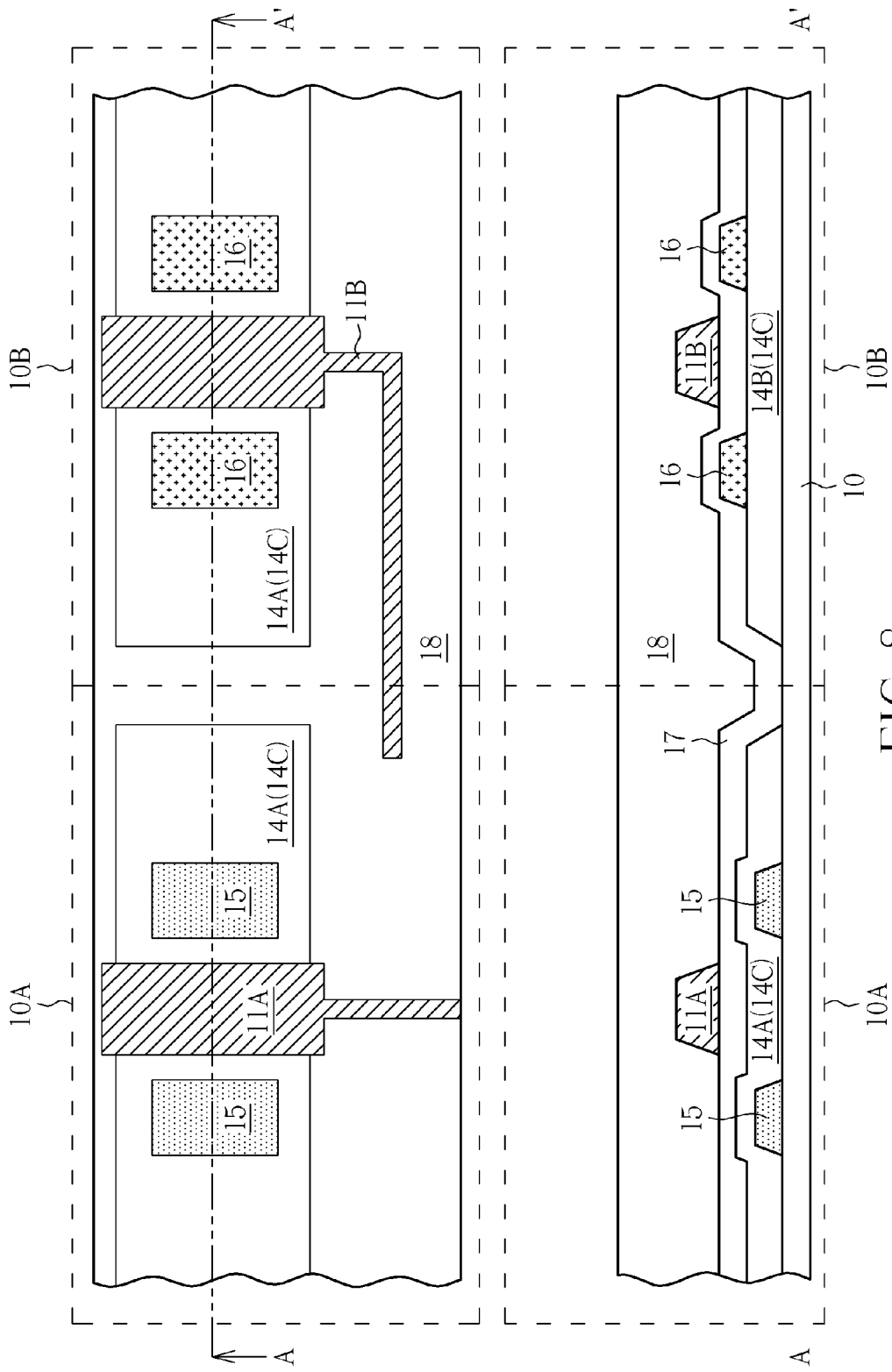

As shown in FIG. 7, a first gate electrode 11A is formed on the gate insulating layer 17 within the first conductivity type region 10A and a second gate electrode 11B is formed on the gate insulating layer 17 within the second conductivity type region 10B. The first gate electrode 11A and the second gate electrode 11B may be formed by patterning one conducting layer, but not limited thereto. As shown in FIG. 8, an inter layer dielectric 18 is then formed on the gate insulating layer 17, the first gate electrode 11A, and the second gate electrode 11B.

Figure 9:
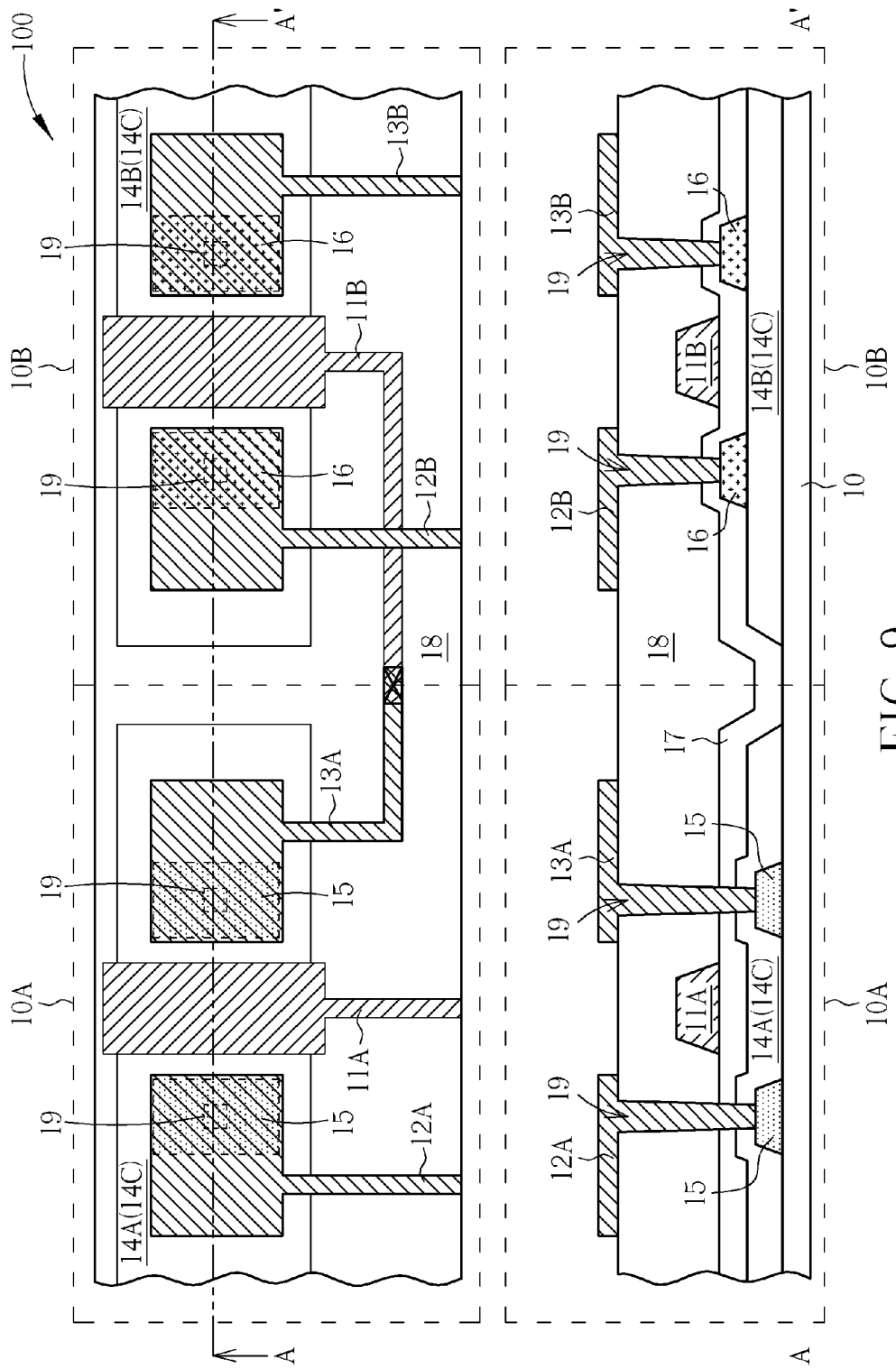

As shown in FIG. 9, a plurality of contact holes 19 are formed in the inter layer dielectric 18 and the gate insulating layer 17. The contact holes 19 within the second conductivity type region 10B partially expose the second patterned doped layer 16, and the contact holes 19 within the first conductivity type region 10A may further penetrate the first semiconductor pattern 14 and partially expose the first patterned doped layer 15. Subsequently, a first source electrode 12A and a first drain electrode 13A are formed on the first conductivity type region 10A. A second source electrode 12B and a second drain electrode 13B are formed on the second conductivity type region 10B. The second source electrode 12B and the second drain electrode 13B are electrically connected to the second patterned doped layer 16 via the contact holes 19 within the second conductivity type region 10B. The first source electrode 12A and the first drain electrode 13A are electrically connected to the first patterned doped layer 15 via the contact holes 19 within the first conductivity type region 10A. In this embodiment, the first source electrode 12A, the first drain electrode 13A, the second source electrode 12B, and the second drain electrode 13B may be formed by an identical conducting layer or be formed by different conducting layers. The conducting layer may include a single layer structure or a multi-layered structure. According to the manufacturing method detailed above, a thin film transistor device 100 shown in FIG. 9 may then be obtained. It is worth noticing that, as shown in FIG. 9, the first drain electrode 13A may be electrically connected to the second gate electrode 11A in the thin film transistor device 100 of this embodiment. The structure of the thin film transistor device 100 may be applied into driving devices such as driving devices of organic light emitting diode display device. Therefore, the thin film transistor device 100 of this embodiment may be regarded as a complementary thin film transistor device, but the present invention is not limited to this and each of the gate electrodes, each of the source electrodes, and each of the drain electrodes may be electrically connected to each other or be electrically separated from each other according to different design considerations.

The following description will detail the different embodiments of the thin film transistor device and the manufacturing method of the present invention. To simplify the description, the following description will detail the dissimilarities among different embodiments and the identical features will not be redundantly described. For making it easier to compare the differences between the embodiments, the identical components in each of the following embodiments are marked with identical symbols.

Figure 10:
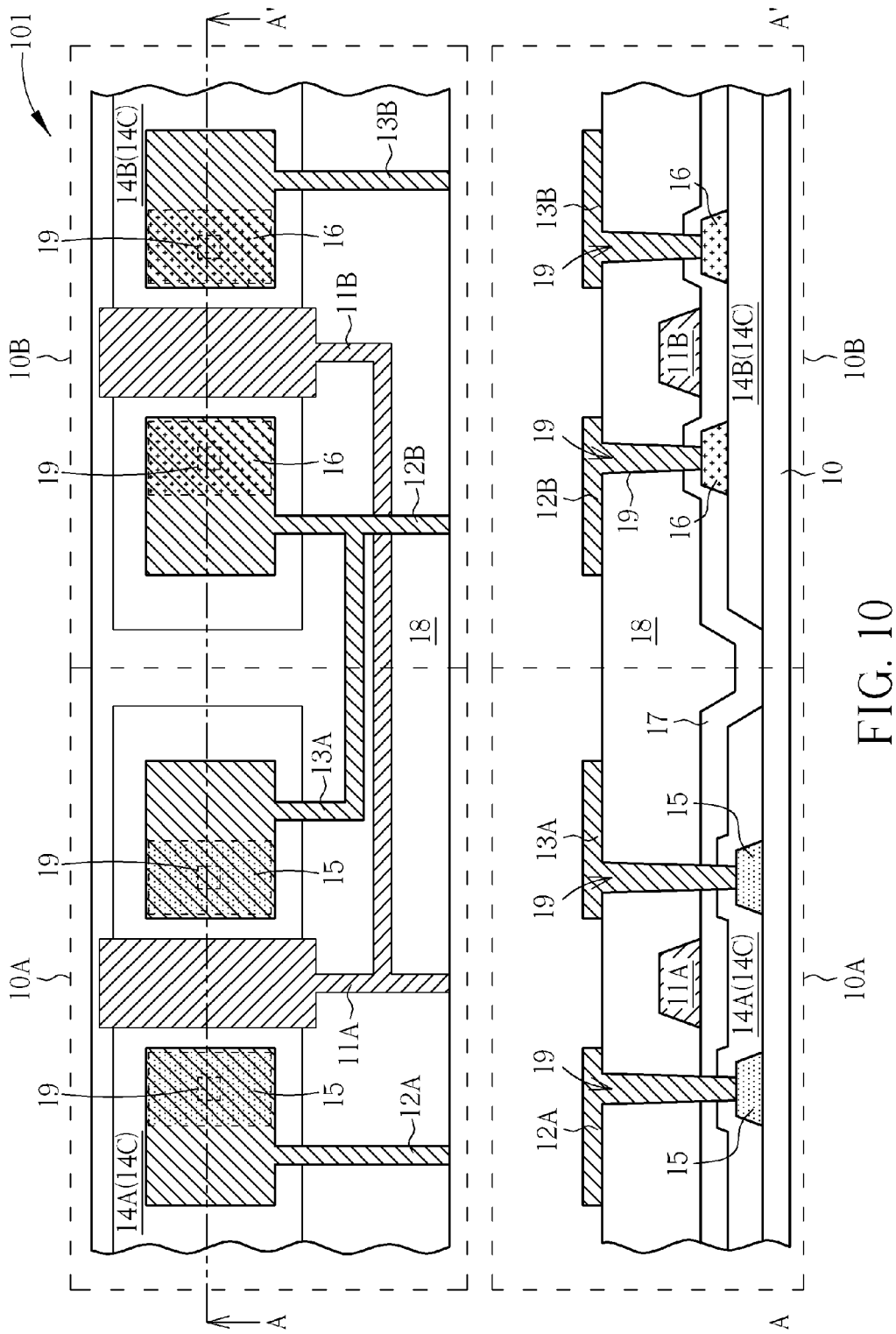
FIG. 10 is a schematic diagram illustrating a thin film transistor device according to an exemplary embodiment of the present invention.

Please refer to FIG. 10, which is a schematic diagram illustrating a thin film transistor device according to an exemplary embodiment of the present invention. As shown in FIG. 10, the difference between a thin film transistor device 101 of this exemplary embodiment and the thin film transistor device 100 described above is that, in the thin film transistor device 101, the first drain electrode 13A is electrically connected to the second source electrode 12B, and the first gate electrode 11A is electrically connected to the second gate electrode 11B. In other words, the thin film transistor device 101 of this embodiment may be regarded as a complementary thin film transistor device, which may be applied in inverters, but the present invention is not limited to this.

Figure 11:
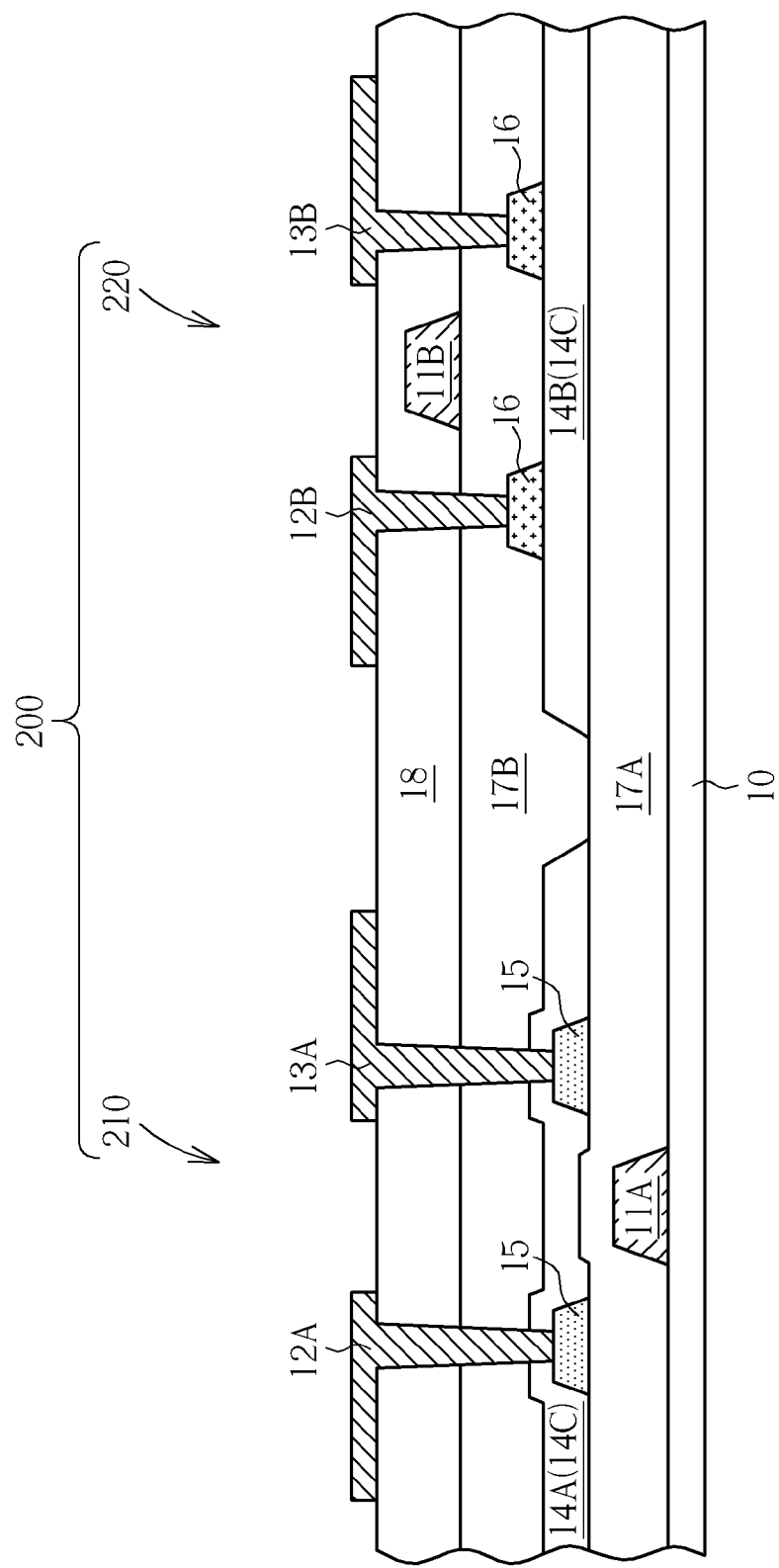
FIG. 11 is a schematic diagram illustrating a thin film transistor device according to a second preferred embodiment of the present invention.
Figure 12:
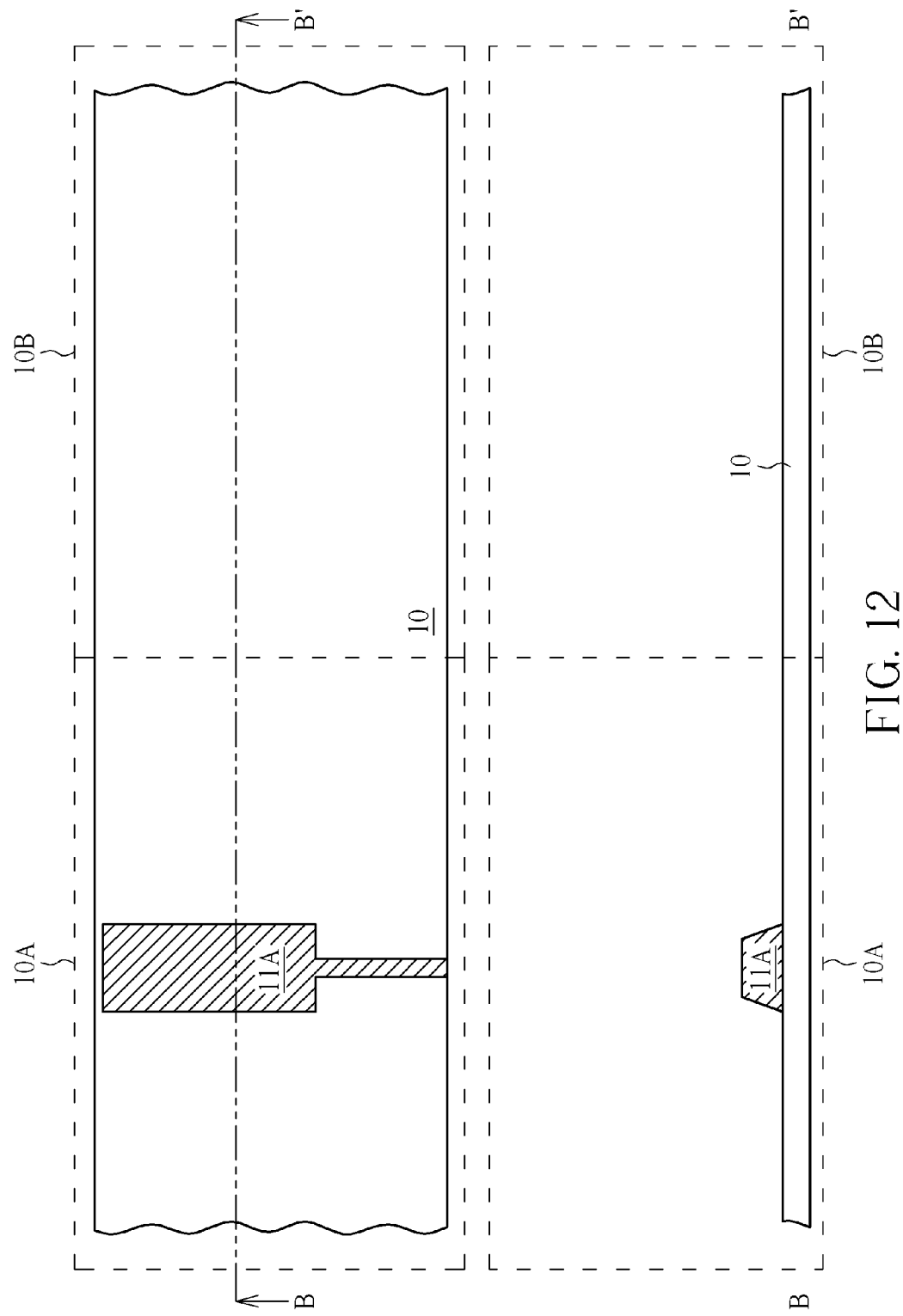
FIGS. 12-21 are schematic diagrams illustrating a manufacturing method of a thin film transistor device according to a second preferred embodiment of the present invention.

Please refer to FIG. 11, which is a schematic diagram illustrating a thin film transistor device according to a second preferred embodiment of the present invention. As shown in FIG. 11, a thin film transistor device 200 includes a first conductivity type thin film transistor 210 and a second conductivity type thin film transistor 220. The difference between the thin film transistor device 200 and the thin film transistor device 100 described above is that the first conductivity type thin film transistor 210 further includes a first gate insulating layer 17A disposed between the substrate 10 and the first patterned doped layer 15; the first gate electrode 11A is disposed between the first gate insulating layer 17A and the substrate 10. In addition, the second conductivity type thin film transistor 220 further includes a second gate insulating layer 17B disposed on the patterned semiconductor layer 14C, on the first patterned doped layer 15, and on the second patterned doped layer 16. The second gate electrode 11B is disposed on the second gate insulating layer 17B. In other words, except for the first gate insulating layer 17A and the second gate insulating layer 17B replacing the gate insulating layer 17 of the first preferred embodiment, and except for the relative position of the first gate electrode 11A, other components and material properties of this embodiment are similar to the first preferred embodiment detailed above and will not be redundantly described. It is worth noticing that, as shown in FIG. 11, the first conductivity type thin film transistor 210 may be regarded as a bottom-gate thin film transistor, and the second conductivity type thin film transistor 220 may be regarded as a top-gate thin film transistor, but the present invention is not limited to this and the position of the second gate electrode 11B may be adjusted according to different design considerations.

Figure 13:
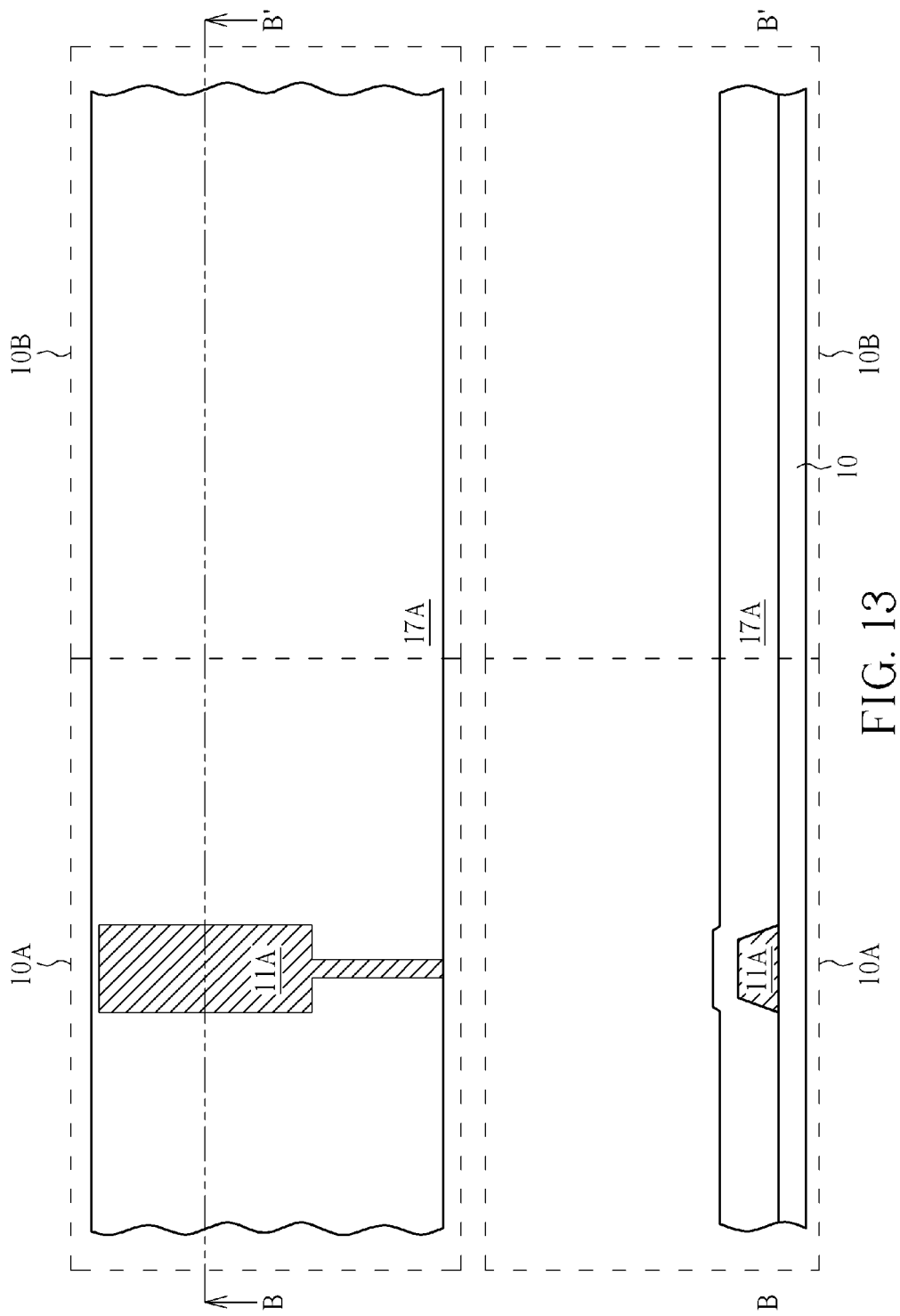
Figure 14:
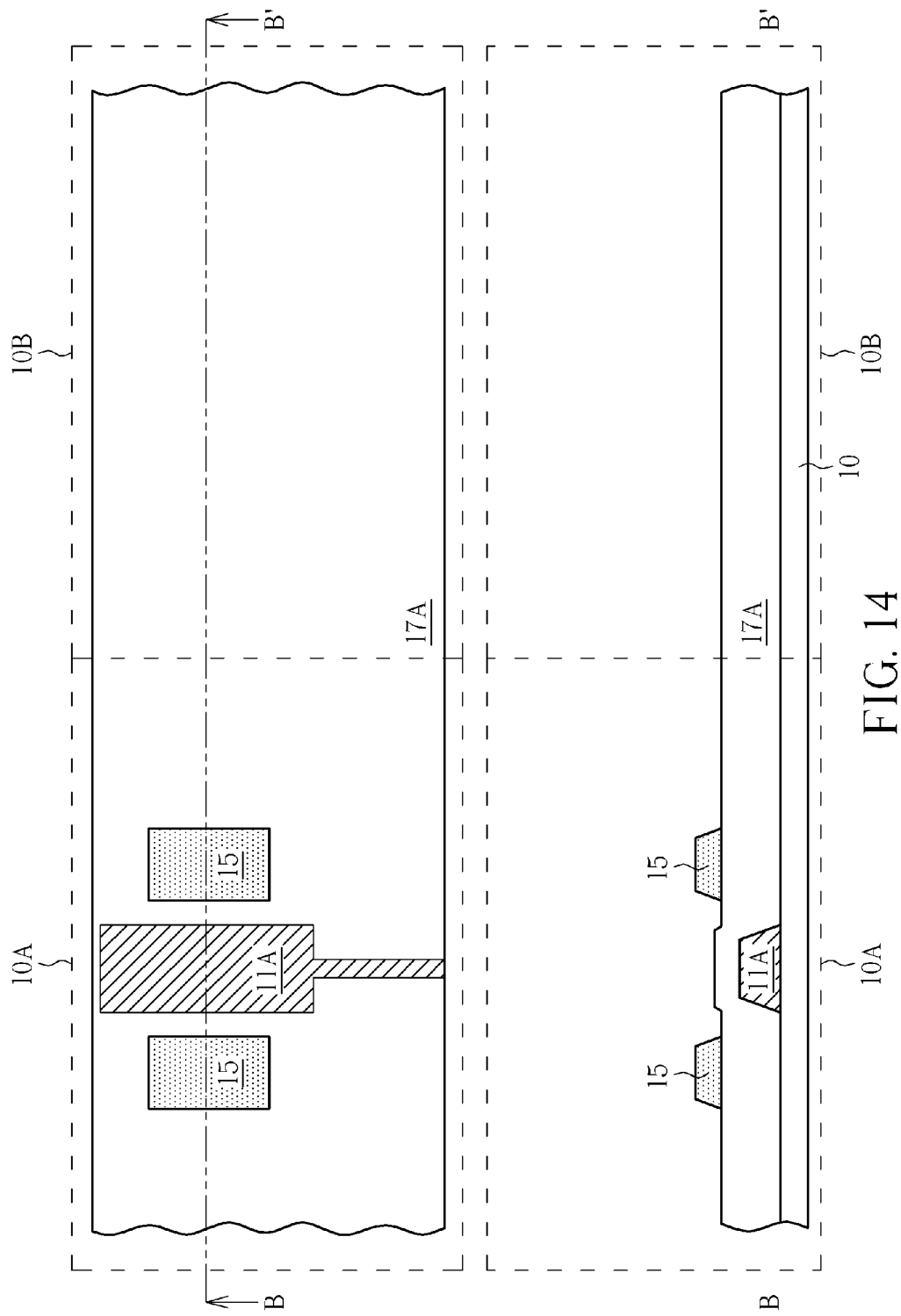
Figure 15:
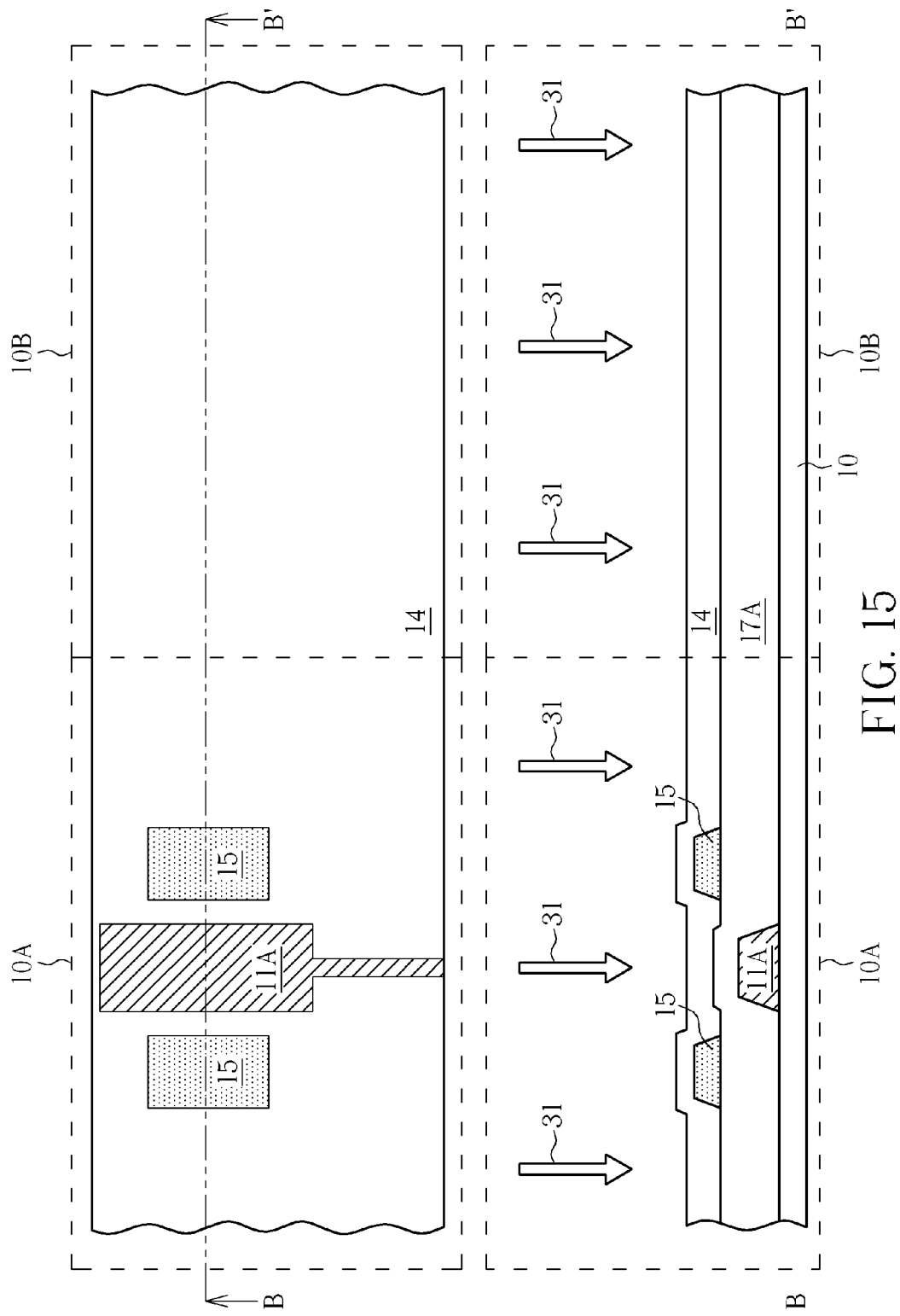
Figure 16:
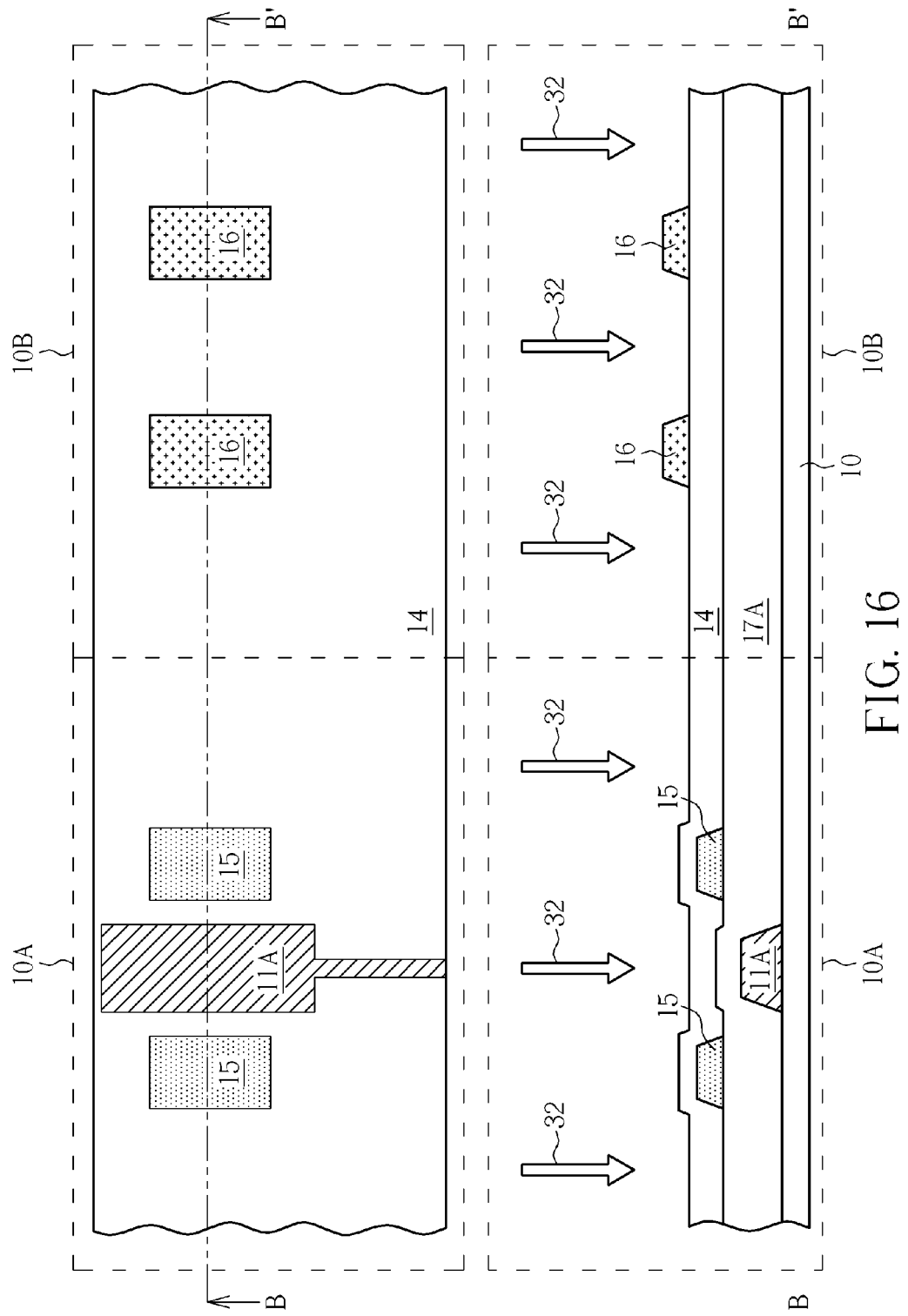
Figure 17:
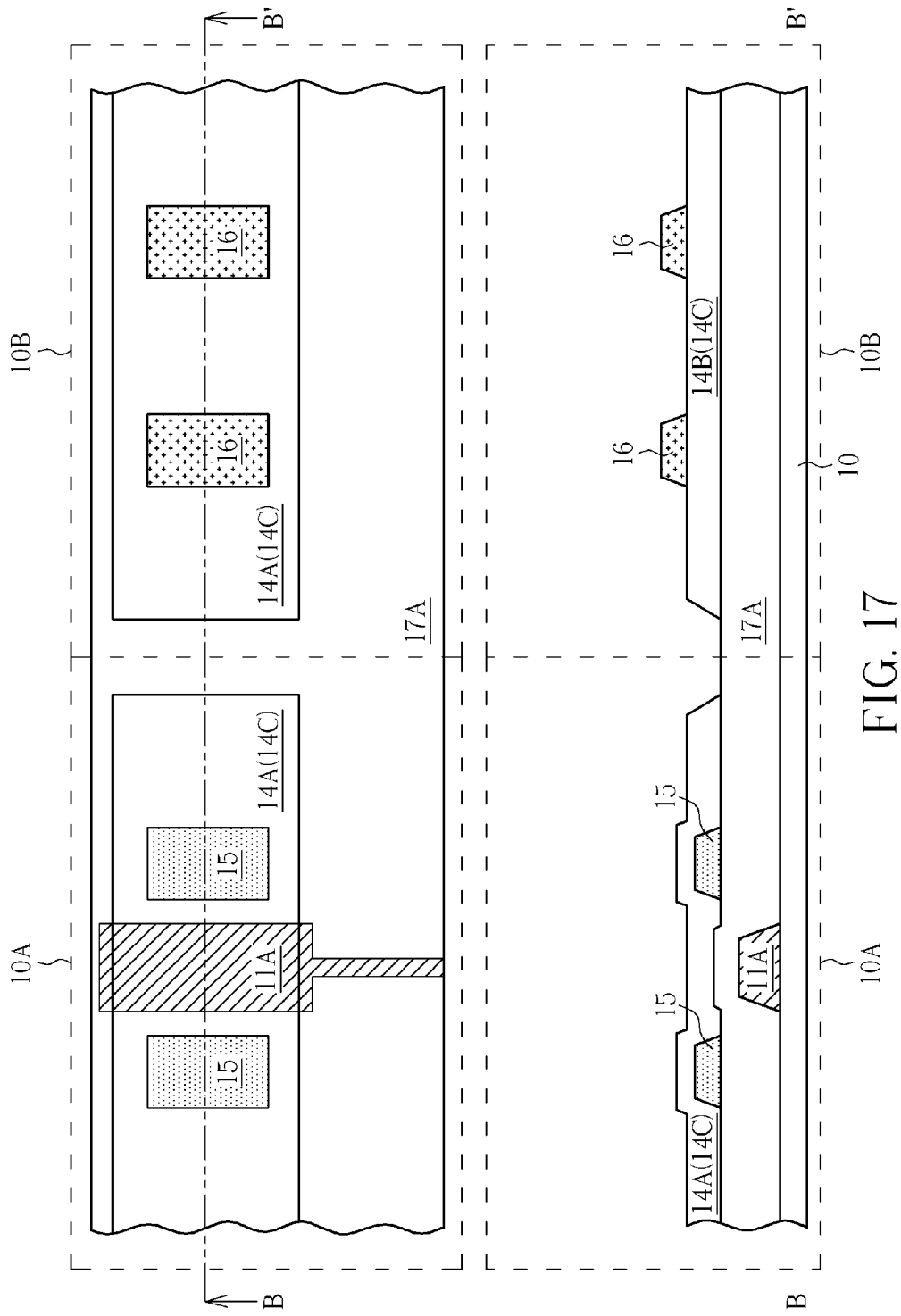
Figure 18:
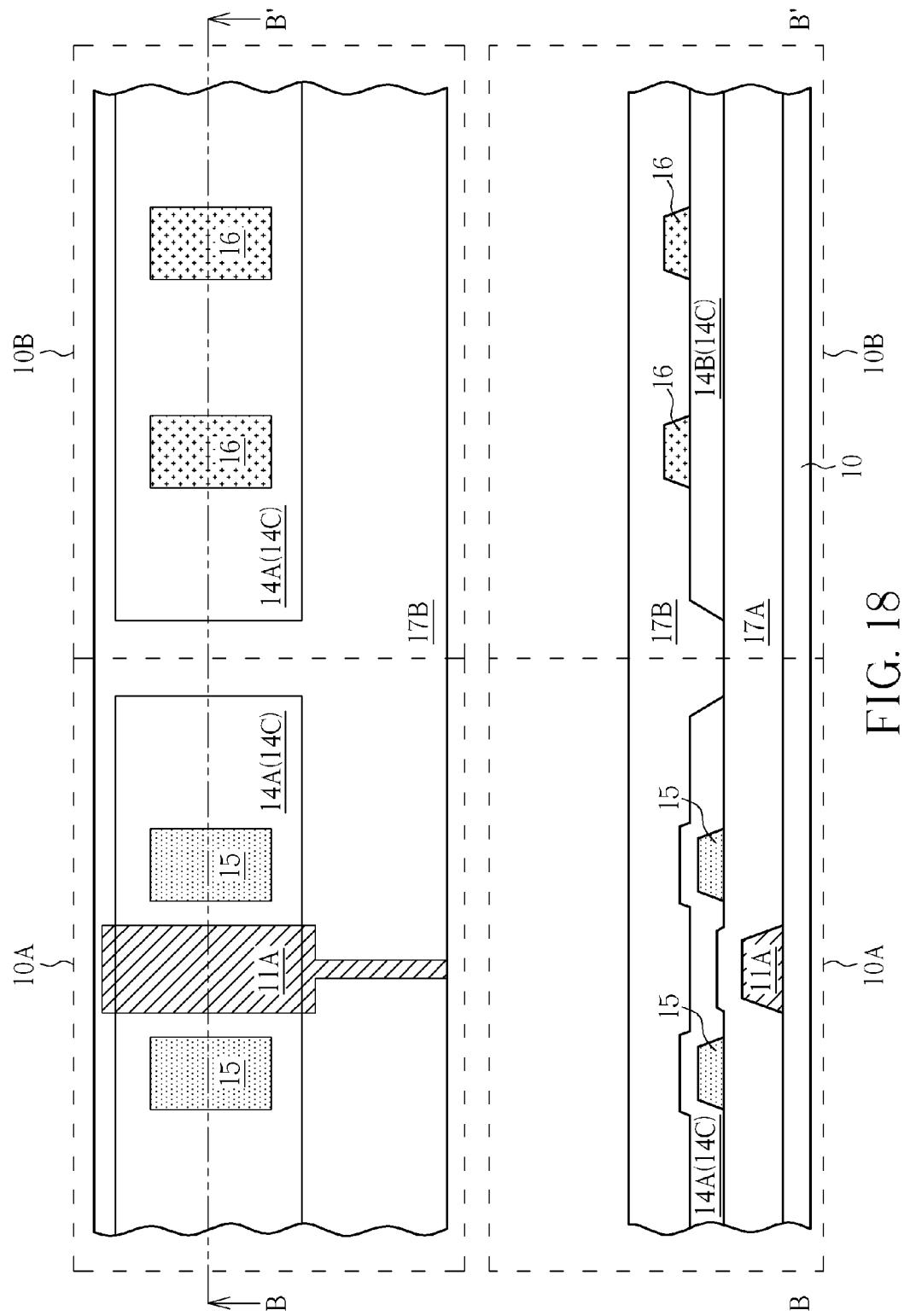
Figure 19:
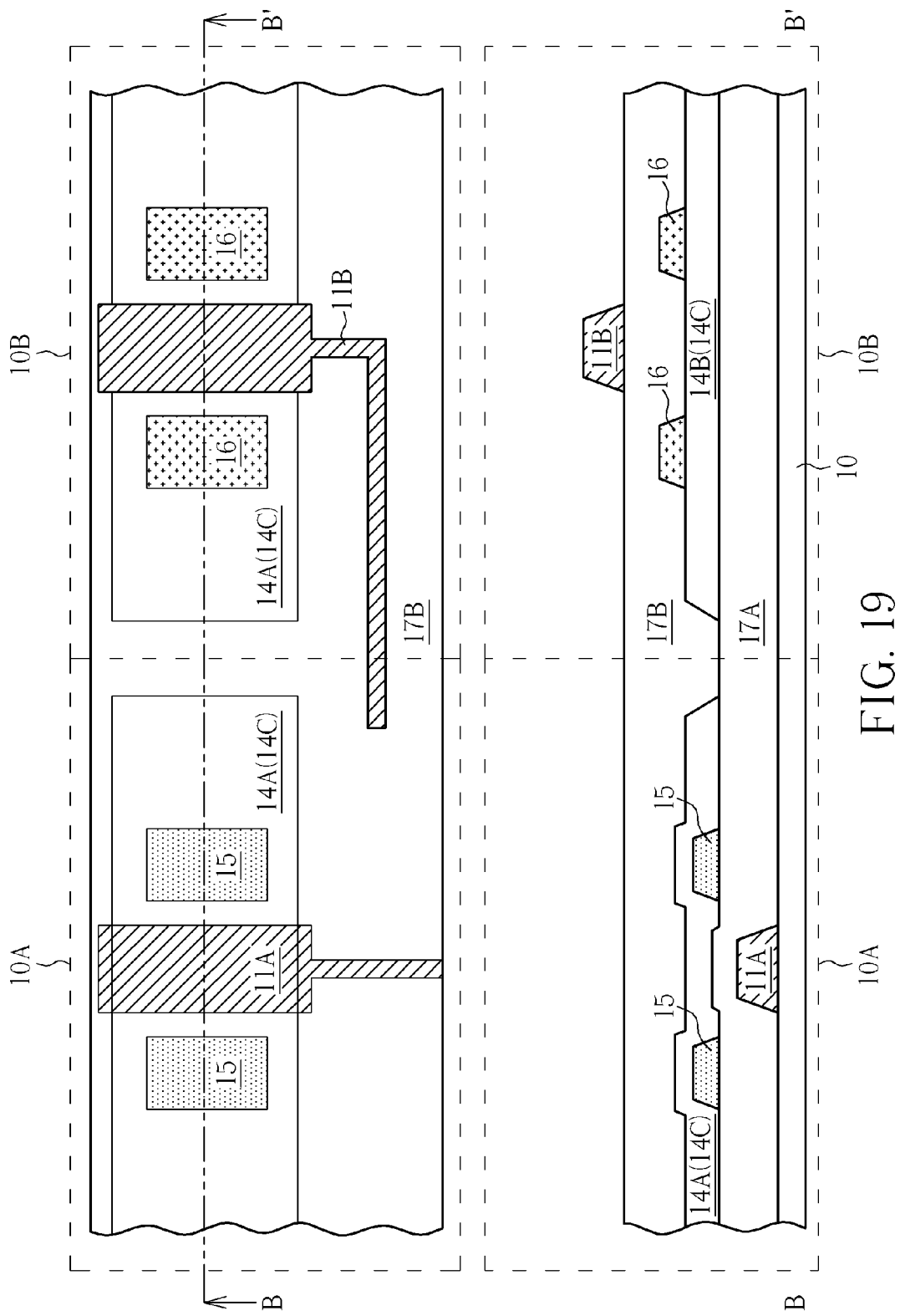
Figure 20:
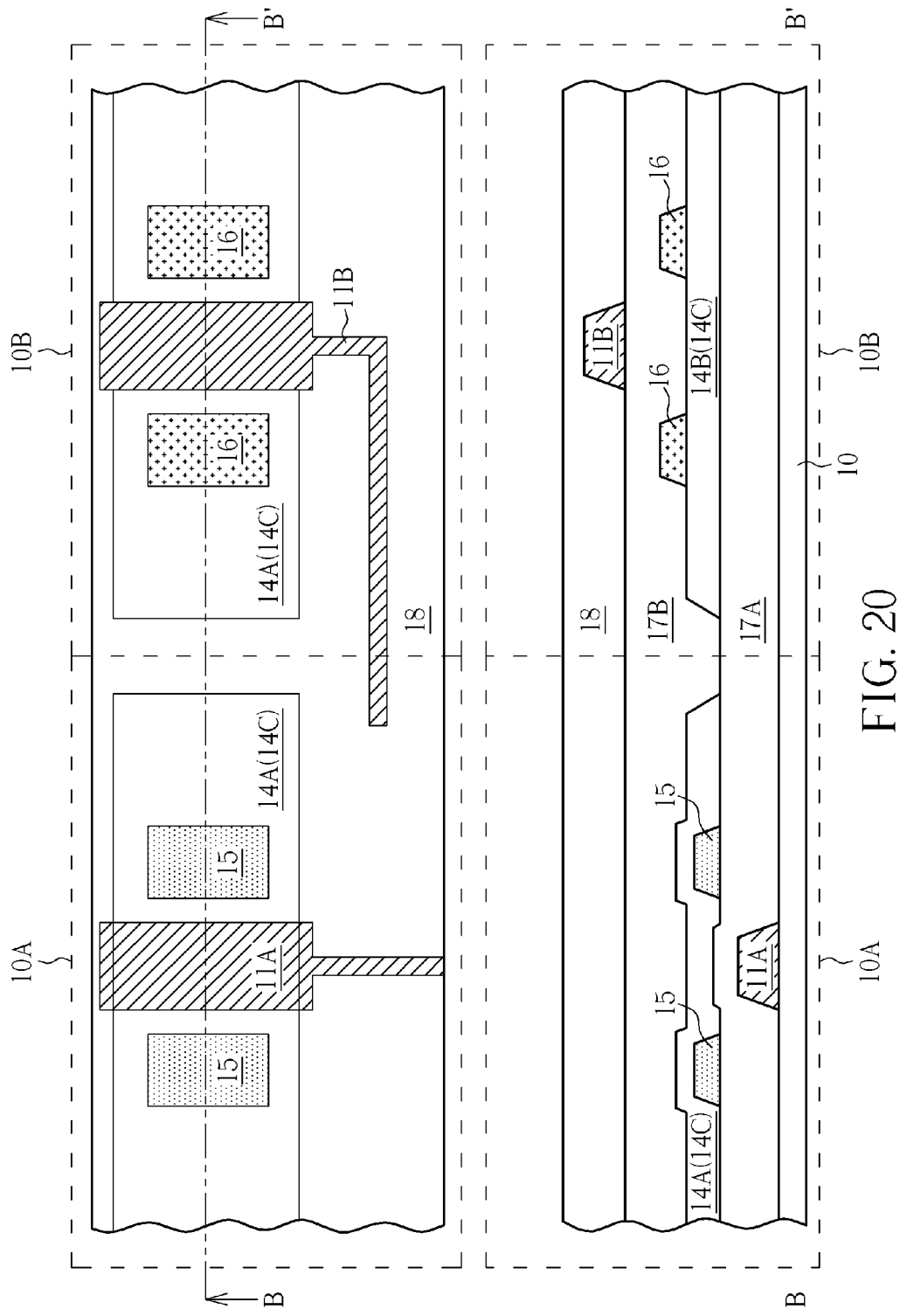
Figure 21:
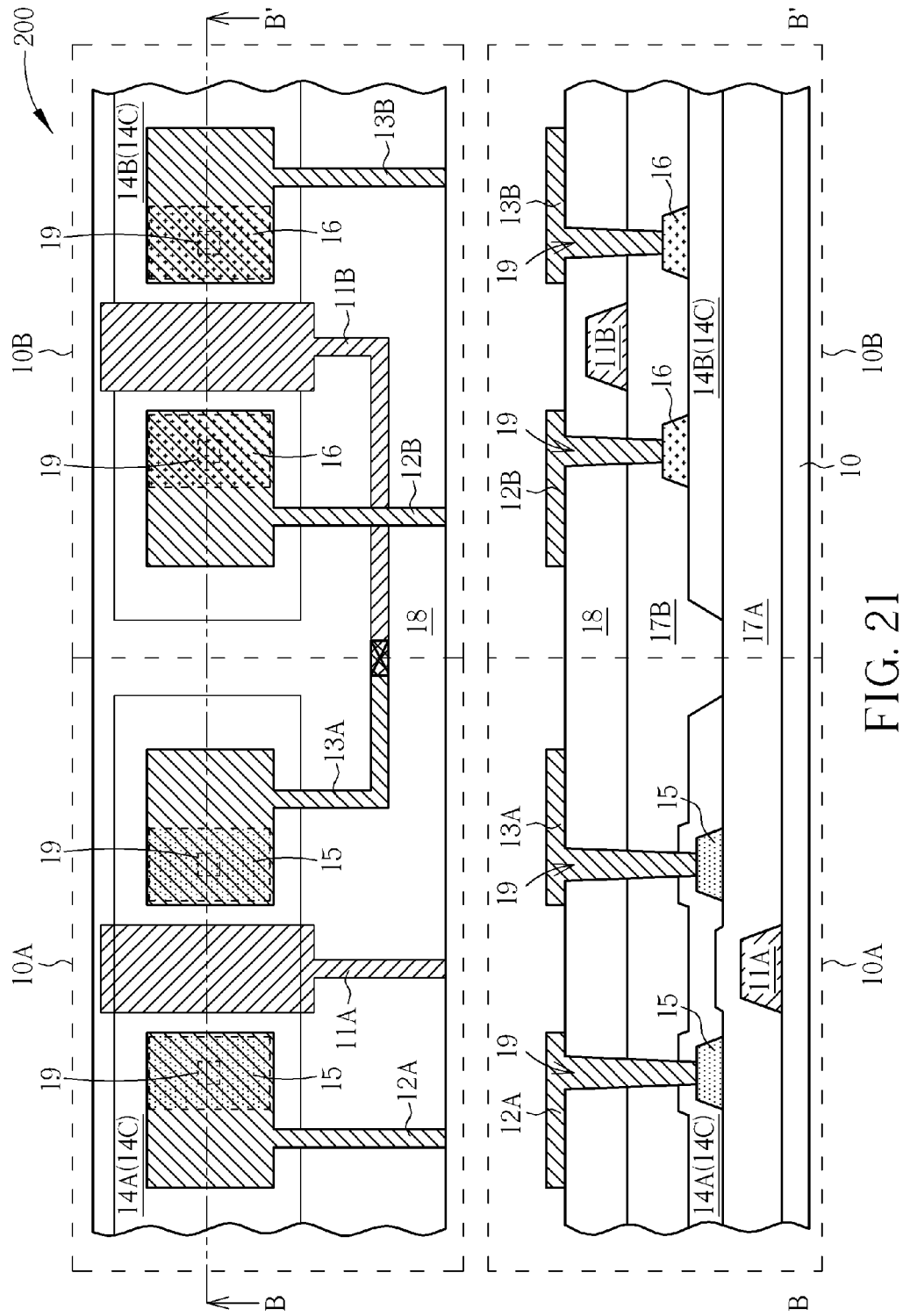

Please refer to FIGS. 12-21. FIGS. 12-21 are schematic diagrams illustrating a manufacturing method of a thin film transistor device according to a second preferred embodiment of the present invention. In FIGS. 12-21, an upper part of each figure is a top-view diagram and a lower part of each figure is a cross-sectional view diagram taken along a cross-sectional line A-A' in the corresponding upper part diagram. It is worth noticing that, as shown in FIGS. 12-21, the difference between this embodiment and the first preferred embodiment is that, in the manufacturing method of the thin film transistor device 200 of this embodiment, the first gate electrode 11A is formed on the first conductivity type region 10A of the substrate 10 before forming the first patterned doped layer 15, and a first gate insulating layer 17A is formed on the substrate 10 for covering the first gate 11A before forming the first patterned doped layer 15 as shown in FIGS. 13-14. Additionally, the manufacturing method of this embodiment further includes forming a second gate insulating layer 17B as shown in FIG. 18, on the substrate 10 for covering the second patterned doped layer 16 and the semiconductor layer 14 within the second conductivity region 10B, which is the second semiconductor pattern 14B, and forming a second gate electrode 11B on the second gate insulating layer 17B within the second conductivity type region 10B as shown in FIG. 19. An inter layer dielectric 18 is then form on the second gate insulating layer 17B and the second gate electrode 11B as shown in FIG. 20. Except for the steps described above, the manufacturing method of the thin film transistor 200 in this embodiment is similar to the first preferred embodiment and will not be redundantly described. It is worth noticing that the thin film transistor device 200 in FIG. 21 may be obtained by the manufacturing process described above. As shown in FIG. 21, in the thin film transistor device 200 of this embodiment, the first drain electrode 13A may be electrically connected to the second gate electrode 11A, and the structure of the thin film transistor device 200 may be applied into driving devices such as driving devices of organic light emitting diode display devices. Therefore, the thin film transistor device 200 of this embodiment may be regarded as a complementary thin film transistor device, but the present invention is not limited to this. Each of the gate electrodes, each of the source electrodes, and each of the drain electrodes may be electrically connected to each other or be electrically separated from each other according to different design considerations.

Figure 22:
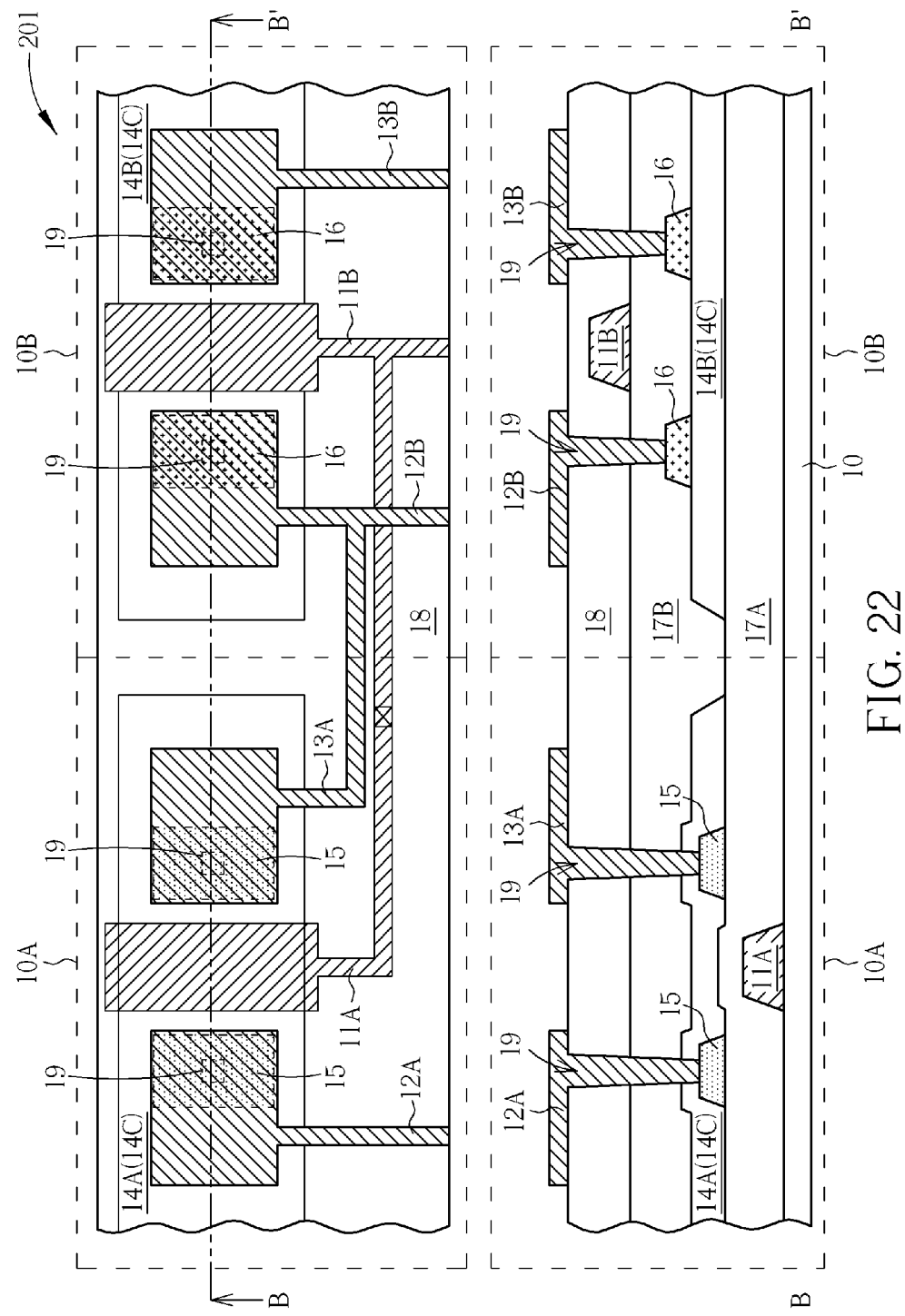
FIG. 22 is a schematic diagram illustrating a thin film transistor device according to another exemplary embodiment of the present invention.

Please refer to FIG. 22, which is a schematic diagram illustrating a thin film transistor device according to another exemplary embodiment of the present invention. As shown in FIG. 22, the difference between a thin film transistor device 201 of this exemplary embodiment and the thin film transistor device 200 described above is that, in the thin film transistor device 201, the first drain electrode 13A is electrically connected to the second source electrode 12B, and the first gate electrode 11A is electrically connected to the second gate electrode 11B. In other words, the thin film transistor device 201 of this embodiment may be regarded as a complementary thin film transistor device, which may be applied in inverters, but the present invention is not limited to this.

Figure 23:
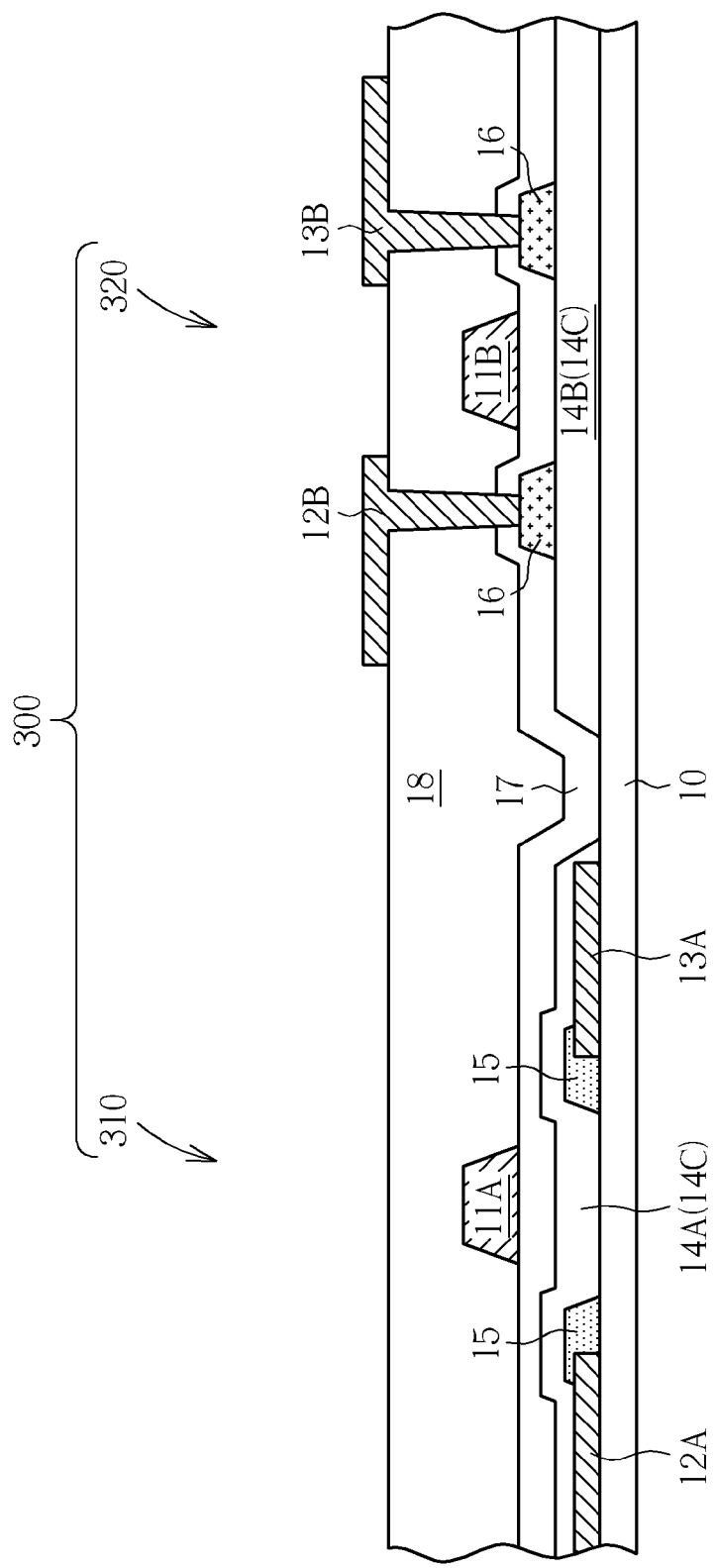
FIG. 23 is a schematic diagram illustrating a thin film transistor device according to a third preferred embodiment of the present invention.

Please refer to FIG. 23, which is a schematic diagram illustrating a thin film transistor device according to a third preferred embodiment of the present invention. As shown in FIG. 23, a thin film transistor device 300 includes a first conductivity type thin film transistor 310 and a second conductivity type thin film transistor 320. The difference between the thin film transistor device 300 and the thin film transistor device 100 described above is that, in this embodiment, the first source electrode 12A and the first drain electrode 13A are at least partially disposed between the substrate 10 and the first patterned doped layer 15. In other words, for manufacturing the thin film transistor device 300 of this embodiment, the first source electrode 12A and the first drain electrode 13A may be formed on the substrate 10 first, and the first patterned doped layer 15 may then be formed for partially covering the first source electrode 12A and the first drain electrode 13A. Except for the first source electrode 12A and the first drain electrode 13A, the other components, material properties, and manufacturing method of the thin film transistor 300 are similar to the first preferred embodiment detailed above and will not be redundantly described. Additionally, in this embodiment, each of the gate electrodes, each of the source electrodes, and each of the drain electrodes may be electrically connected to each other or be electrically separated from each other according to different design considerations.

Figure 24:
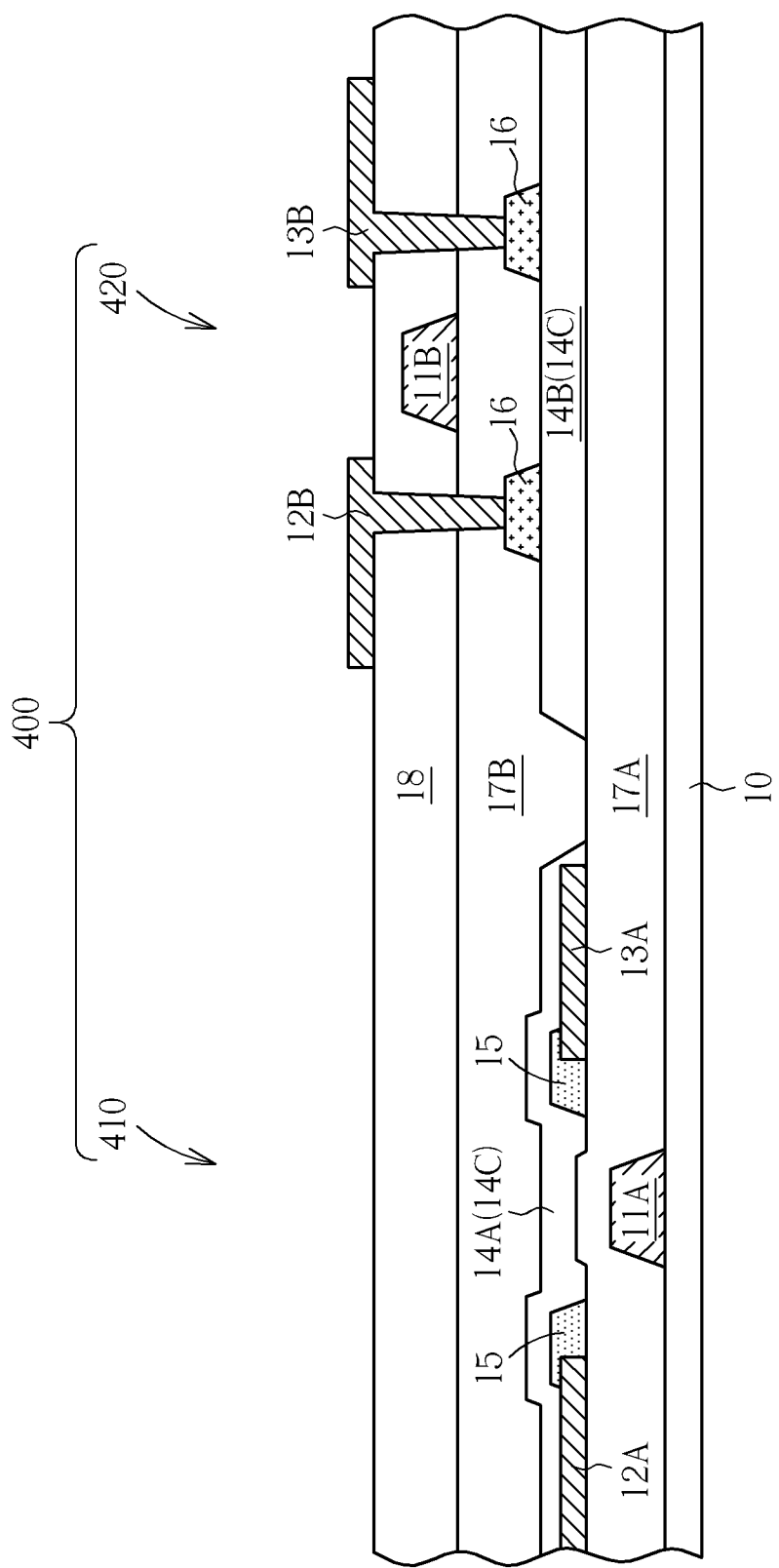
FIG. 24 is a schematic diagram illustrating a thin film transistor device according to a fourth preferred embodiment of the present invention.

Please refer to FIG. 24, which is a schematic diagram illustrating a thin film transistor device according to a fourth preferred embodiment of the present invention. As shown in FIG. 24, a thin film transistor device 400 includes a first conductivity type thin film transistor 410 and a second conductivity type thin film transistor 420. The difference between the thin film transistor device 400 and the thin film transistor device 200 described above is that, in this embodiment, the first source electrode 12A and the first drain electrode 13A are at least partially disposed between the first gate insulating layer 17A and the first patterned doped layer 15. In other words, for manufacturing the thin film transistor device 400 of this embodiment, the first source electrode 12A and the first drain electrode 13A may be formed on the first gate insulating layer 17A after forming the first gate insulating layer 17A, and the first patterned doped layer 15 may then be formed for partially covering the first source electrode 12A and the first drain electrode 13A. Except for the first source electrode 12A and the first drain electrode 13A, the other components, material properties, and manufacturing method of the thin film transistor 400 are similar to the second preferred embodiment detailed above and will not be redundantly described. Additionally, in this embodiment, each of the gate electrodes, each of the source electrodes, and each of the drain electrodes may be electrically connected to each other or be electrically separated from each other according to different design considerations.

To summarize the above descriptions, in the thin film transistor device of the present invention, different conductivity type doped layers are disposed respectively on different surfaces of the semiconductor layer for simplifying the manufacturing process, and the laser treatment is employed for lowering the electrical resistance of the doped layer, which is formed by the non-implant process. Therefore, the thin film transistor device with high performance may be obtained by the simplified manufacturing process.

Those skilled in the art will readily observe that numerous modifications and alterations of the device and method may be made while retaining the teachings of the invention. Accordingly, the above disclosure should be construed as limited only by the metes and bounds of the appended claims.

What is claimed is:

1. A thin film transistor device, disposed on a substrate, the thin film transistor device comprising:
   a first conductivity type thin film transistor, comprising a first patterned doped layer, a first gate electrode, a first source electrode, a first drain electrode, and a first semiconductor pattern, wherein the first source electrode and the first drain electrode are electrically connected to the first patterned doped layer; and
   a second conductivity type thin film transistor, comprising a second patterned doped layer, a second gate electrode, a second source electrode, a second drain electrode, and a second semiconductor pattern, wherein the second source electrode and the second drain electrode are electrically connected to the second patterned doped layer;
   wherein the first semiconductor pattern and the second semiconductor pattern form a patterned semiconductor layer, the first patterned doped layer is disposed under the first semiconductor pattern, and the second patterned doped layer is disposed on the second semiconductor pattern.

2. The thin film transistor device of claim 1, wherein the first patterned doped layer includes at least one N type dopant, and the second patterned doped layer includes at least one P type dopant.

3. The thin film transistor device of claim 1, wherein the patterned semiconductor layer includes a polysilicon layer.

4. The thin film transistor device of claim 1, further comprising a gate insulating layer, disposed on the patterned semiconductor layer, on the first patterned doped layer and on the second patterned doped layer, wherein the first gate electrode and the second gate electrode are disposed on the gate insulating layer.

5. The thin film transistor device of claim 4, further comprising an inter layer dielectric, disposed on the gate insulating layer, on the first gate electrode, and on the second gate electrode, wherein the second source electrode and the second drain electrode penetrate the inter layer dielectric and the gate insulating layer for being electrically connected to the second patterned doped layer, and the first source electrode and the first drain electrode penetrate the inter layer dielectric, the gate insulating layer, and the first semiconductor pattern for being electrically connected to the first patterned doped layer.

6. The thin film transistor device of claim 4, further comprising an inter layer dielectric, disposed on the gate insulating layer, on the first gate electrode and on the second gate electrode, wherein the second source electrode and the second drain electrode penetrate the inter layer dielectric and the gate insulating layer for being electrically connected to the second patterned doped layer, and the first source electrode and the first drain electrode are at least partially disposed between the substrate and the first patterned doped layer.

7. The thin film transistor device of claim 1, wherein the first conductivity type thin film transistor further comprises a first gate insulating layer disposed between the substrate and the first patterned doped layer, and the first gate electrode is disposed between the first gate insulating layer and the substrate; and
   the second conductivity type thin film transistor further comprises a second gate insulating layer disposed on the patterned semiconductor layer, on the first patterned doped layer, and on the second patterned doped layer, and the second gate electrode is disposed on the second gate insulating layer.

8. The thin film transistor device of claim 1, wherein the first drain electrode is electrically connected to the second gate electrode.

9. The thin film transistor device of claim 1, wherein the first drain electrode is electrically connected to the second source electrode, and the first gate electrode is electrically connected to the second gate electrode.

10. A manufacturing method of a thin film transistor device, comprising:
    providing a substrate, wherein the substrate has a first conductivity type region and a second conductivity type region;
    forming a first patterned doped layer on the first conductivity type region of the substrate;
    forming a semiconductor layer on the first conductivity type region and the second conductivity type region of the substrate, wherein the semiconductor layer within the first conductivity type region covers the first patterned doped layer, and the first patterned doped layer is formed before forming the semiconductor layer;
    forming a second patterned doped layer on the semiconductor layer within the second conductivity type region;
    patterning the semiconductor layer, for separating the semiconductor layer within the first conductivity type region from the semiconductor layer within the second conductivity type region; and
    performing at least a laser treatment on the semiconductor layer, the first patterned doped layer, and the second patterned doped layer.

11. The manufacturing method of the thin film transistor device of claim 10, further comprising performing the laser treatment twice, respectively before and after forming the second patterned doped layer.

12. The manufacturing method of the thin film transistor device of claim 10, wherein the laser treatment is performed after forming the second patterned doped layer.

13. The manufacturing method of the thin film transistor device of claim 10, wherein the first patterned doped layer and the second patterned doped layer are respectively formed by a chemical vapor deposition process.

14. The manufacturing method of the thin film transistor device of claim 10, wherein the first patterned doped layer includes at least one N type dopant, and the second patterned doped layer includes at least one P type dopant.

15. The manufacturing method of the thin film transistor device of claim 10, wherein the semiconductor layer is transformed from an amorphous silicon layer into a polysilicon layer by the laser treatment.

16. The manufacturing method of the thin film transistor device of claim 10, further comprising:

forming a gate insulating layer for covering the semiconductor layer within the first conductivity type region, the semiconductor layer within the second conductivity type region, and the second patterned doped layer;

forming a first gate electrode on the gate insulating layer within the first conductivity type region and a second gate electrode on the gate insulating layer within the second conductivity type region;

forming a first source electrode and a first drain electrode on the first conductivity type region, and electrically connecting the first source electrode and the first drain electrode to the first patterned doped layer; and forming a second source electrode and a second drain electrode on the second conductivity type region, and electrically connecting the second source electrode and the second drain electrode to the second patterned doped layer.

17. The manufacturing method of the thin film transistor device of claim 16, further comprising:

forming an inter layer dielectric on the gate insulating layer, the first gate electrode, and the second gate electrode; and forming a plurality of contact holes in the inter layer dielectric and the gate insulating layer for partially exposing the second patterned doped layer, wherein the second source electrode and the second drain electrode are electrically connected to the second patterned doped layer via the contact holes.

18. The manufacturing method of the thin film transistor device of claim 10, further comprising:

forming a first gate electrode on the first conductivity type region of the substrate before forming the first patterned doped layer;

forming a first gate insulating layer on the substrate for covering the first gate before forming the first patterned doped layer;

forming a second gate insulating layer on the substrate for covering the second patterned doped layer and the semiconductor layer within the second conductivity region;

forming a second gate electrode on the second gate insulating layer within the second conductivity type region;

forming a first source electrode and a first drain electrode on the first conductivity type region, and electrically connecting the first source electrode and the first drain electrode to the first patterned doped layer; and forming a second source electrode and a second drain electrode on the second conductivity type region, and electrically connecting the second source electrode and the second drain electrode to the second patterned doped layer.

19. The manufacturing method of the thin film transistor device of claim 18, further comprising:

forming an inter layer dielectric on the second gate insulating layer and the second gate electrode; and forming a plurality of contact holes in the inter layer dielectric and the second gate insulating layer for partially exposing the second patterned doped layer, wherein the second source electrode and the second drain electrode are electrically connected to the second patterned doped layer via the contact holes.

20. The manufacturing method of the thin film transistor device of claim 10, wherein the first patterned doped layer and the second patterned doped layer are formed by a non-implant process.

21. A thin film transistor device, disposed on a substrate, the thin film transistor device comprising:

a first conductivity type thin film transistor, comprising a first patterned doped layer, a first gate electrode, a first source electrode, a first drain electrode, and a first semiconductor pattern, wherein the first source electrode and the first drain electrode are electrically connected to the first patterned doped layer; and a second conductivity type thin film transistor, comprising a second patterned doped layer, a second gate electrode, a second source electrode, a second drain electrode, and a second semiconductor pattern, wherein the second source electrode and the second drain electrode are electrically connected to the second patterned doped layer, wherein the first semiconductor pattern and the second semiconductor pattern form a patterned semiconductor layer, the first patterned doped layer is disposed under and electrically contacts the first semiconductor pattern, and the second patterned doped layer is disposed on and electrically contacts the second semiconductor pattern.

22. The thin film transistor device of claim 21, wherein the first patterned doped layer includes at least one N type dopant, and the second patterned doped layer includes at least one P type dopant.

23. The thin film transistor device of claim 21, wherein the patterned semiconductor layer includes a polysilicon layer.

24. The thin film transistor device of claim 21, further comprising a gate insulating layer, disposed on the patterned semiconductor layer, on the first patterned doped layer and on the second patterned doped layer, wherein the first gate electrode and the second gate electrode are disposed on the gate insulating layer.

25. The thin film transistor device of claim 24, further comprising an inter layer dielectric, disposed on the gate insulating layer, on the first gate electrode, and on the second gate electrode, wherein the second source electrode and the second drain electrode penetrate the inter layer dielectric and the gate insulating layer for being electrically connected to the second patterned doped layer, and the first source electrode and the first drain electrode penetrate the inter layer dielectric, the gate insulating layer, and the first semiconductor pattern for being electrically connected to the first patterned doped layer.

26. The thin film transistor device of claim 24, further comprising an inter layer dielectric, disposed on the gate insulating layer, on the first gate electrode and on the second gate electrode, wherein the second source electrode and the second drain electrode penetrate the inter layer dielectric and the gate insulating layer for being electrically connected to the second patterned doped layer, and the first source electrode and the first drain electrode are at least partially disposed between the substrate and the first patterned doped layer.

27. The thin film transistor device of claim 21, wherein the first conductivity type thin film transistor further comprises a first gate insulating layer disposed between the substrate and the first patterned doped layer, and the first gate electrode is disposed between the first gate insulating layer and the substrate; and the second conductivity type thin film transistor further comprises a second gate insulating layer disposed on the patterned semiconductor layer, on the first patterned doped layer, and on the second patterned doped layer, and the second gate electrode is disposed on the second gate insulating layer.

28. The thin film transistor device of claim 21, wherein the first drain electrode is electrically connected to the second gate electrode.

29. The thin film transistor device of claim 21, wherein the first drain electrode is electrically connected to the second source electrode, and the first gate electrode is electrically connected to the second gate electrode.

30. A thin film transistor device, disposed on a substrate, the thin film transistor device comprising:
a first conductivity type thin film transistor, comprising a first patterned doped layer, a first gate electrode, a first source electrode, a first drain electrode, and a first semiconductor pattern, wherein the first source electrode and the first drain electrode are electrically connected to the first patterned doped layer and the first semiconductor pattern; and
a second conductivity type thin film transistor, comprising a second patterned doped layer, a second gate electrode, a second source electrode, a second drain electrode, and a second semiconductor pattern, wherein the second source electrode and the second drain electrode are electrically connected to the second patterned doped layer and the second semiconductor pattern;
wherein the first semiconductor pattern and the second semiconductor pattern form a patterned semiconductor layer, the first patterned doped layer is disposed under the first semiconductor pattern, and the second patterned doped layer is disposed on the second semiconductor pattern.

31. The thin film transistor device of claim 30, wherein the first patterned doped layer includes at least one N type dopant, and the second patterned doped layer includes at least one P type dopant.

32. The thin film transistor device of claim 30, wherein the patterned semiconductor layer includes a polysilicon layer.

33. The thin film transistor device of claim 30, further comprising a gate insulating layer, disposed on the patterned semiconductor layer, on the first patterned doped layer and on the second patterned doped layer, wherein the first gate electrode and the second gate electrode are disposed on the gate insulating layer.

34. The thin film transistor device of claim 33, further comprising an inter layer dielectric, disposed on the gate insulating layer, on the first gate electrode, and on the second gate electrode, wherein the second source electrode and the second drain electrode penetrate the inter layer dielectric and the gate insulating layer for being electrically connected to the second patterned doped layer, and the first source electrode and the first drain electrode penetrate the inter layer dielectric, the gate insulating layer, and the first semiconductor pattern for being electrically connected to the first patterned doped layer.

35. The thin film transistor device of claim 33, further comprising an inter layer dielectric, disposed on the gate insulating layer, on the first gate electrode and on the second gate electrode, wherein the second source electrode and the second drain electrode penetrate the inter layer dielectric and the gate insulating layer for being electrically connected to the second patterned doped layer, and the first source electrode and the first drain electrode are at least partially disposed between the substrate and the first patterned doped layer.

36. The thin film transistor device of claim 30, wherein the first conductivity type thin film transistor further comprises a first gate insulating layer disposed between the substrate and the first patterned doped layer, and the first gate electrode is disposed between the first gate insulating layer and the substrate; and
the second conductivity type thin film transistor further comprises a second gate insulating layer disposed on the patterned semiconductor layer, on the first patterned doped layer, and on the second patterned doped layer, and the second gate electrode is disposed on the second gate insulating layer.

37. The thin film transistor device of claim 30, wherein the first drain electrode is electrically connected to the second gate electrode.

38. The thin film transistor device of claim 30, wherein the first drain electrode is electrically connected to the second source electrode, and the first gate electrode is electrically connected to the second gate electrode.

* * * * *